(12) United States Patent
Oikawa

(10) Patent No.: US 11,171,112 B2
(45) Date of Patent: Nov. 9, 2021

(54) SEMICONDUCTOR DEVICE

(71) Applicant: RENESAS ELECTRONICS CORPORATION, Tokyo (JP)

(72) Inventor: Ryuichi Oikawa, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 6 days.

(21) Appl. No.: 16/223,766

(22) Filed: Dec. 18, 2018

(65) Prior Publication Data

US 2019/0229088 A1    Jul. 25, 2019

(30) Foreign Application Priority Data

Jan. 22, 2018    (JP) .............................. JP2018-008133

(51) Int. Cl.
*H01L 25/065*    (2006.01)
*H01L 23/538*    (2006.01)
(Continued)

(52) U.S. Cl.
CPC ...... *H01L 25/0652* (2013.01); *H01L 23/5383* (2013.01); *H01L 23/5386* (2013.01); *H01L 23/552* (2013.01); *H01L 25/18* (2013.01); *H01L 24/16* (2013.01); *H01L 24/17* (2013.01); *H01L 2224/16227* (2013.01); *H01L 2224/16235* (2013.01); *H01L 2224/17181* (2013.01); *H01L 2225/06513* (2013.01); *H01L 2225/06517* (2013.01); *H01L 2225/06537* (2013.01);
(Continued)

(58) Field of Classification Search
CPC ............. H01L 23/5383; H01L 23/5386; H01L 23/552; H01L 23/53209; H01L 25/0652; H01L 2225/06537
See application file for complete search history.

(56) References Cited

U.S. PATENT DOCUMENTS 8,803,320 B2 *   8/2014   Chen ................... H01L 23/5225
                                                         257/758
9,917,026 B2     3/2018   Oikawa et al.
(Continued)

FOREIGN PATENT DOCUMENTS

WO    2016/103359 A1    6/2016

OTHER PUBLICATIONS

W. Beyene, et al. "Signal and Power Integrity Analysis of High-Speed Links with Silicon Interposer", Proceeding of the 67th Electronic Components and Technology Conference, 293, (2017).

*Primary Examiner* — Tuan A Hoang
(74) *Attorney, Agent, or Firm* — McDermott Will & Emery LLP

(57) ABSTRACT

Cross talk among wirings formed in an interposer is reduced while increase in a parasitic capacitance among the wirings formed in the interposer is suppressed. A semiconductor device has an interposer including a first wiring layer, a second wiring layer formed above the first wiring layer, and a third wiring layer formed above the second wiring layer. In a plan view, a first signal wiring formed in the first wiring layer and a reference wiring formed in the second wiring layer are distant from each other. Similarly, in a plan view, the reference wiring formed in the second wiring layer and a third signal wiring formed in a third wiring layer are distant from each other.

16 Claims, 22 Drawing Sheets

(51) Int. Cl.
*H01L 25/18* (2006.01)
*H01L 23/552* (2006.01)
*H01L 23/00* (2006.01)

(52) U.S. Cl.
CPC ............... *H01L 2225/06541* (2013.01); *H01L 2924/1431* (2013.01); *H01L 2924/1434* (2013.01); *H01L 2924/157* (2013.01); *H01L 2924/15192* (2013.01); *H01L 2924/15311* (2013.01)

(56) References Cited

U.S. PATENT DOCUMENTS

| | | | |
|---|---|---|---|
| 2011/0018129 A1* | 1/2011 | Suzuki | G02F 1/13452 257/737 |
| 2014/0117552 A1* | 5/2014 | Qian | H01L 23/53228 257/762 |
| 2016/0233178 A1* | 8/2016 | Lamy | H01L 23/66 |
| 2018/0366416 A1* | 12/2018 | Wang | H01L 23/5386 |
| 2018/0374798 A1* | 12/2018 | Lee | H01L 23/552 |
| 2019/0207304 A1* | 7/2019 | Kim | H01Q 21/08 |

* cited by examiner

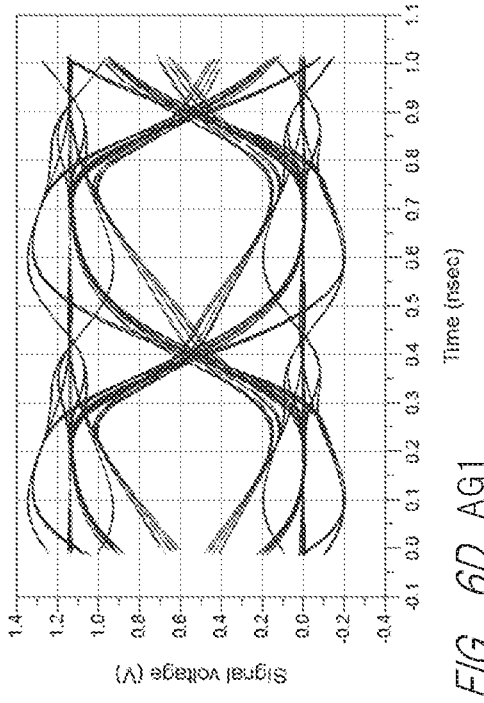
FIG. 6A AG2
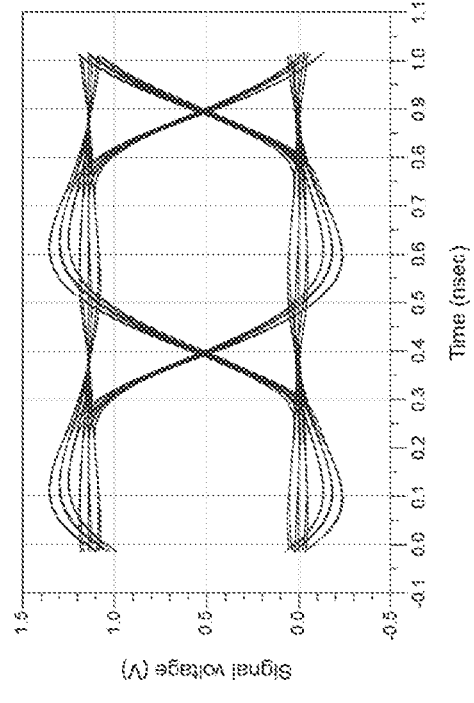
FIG. 6C VT
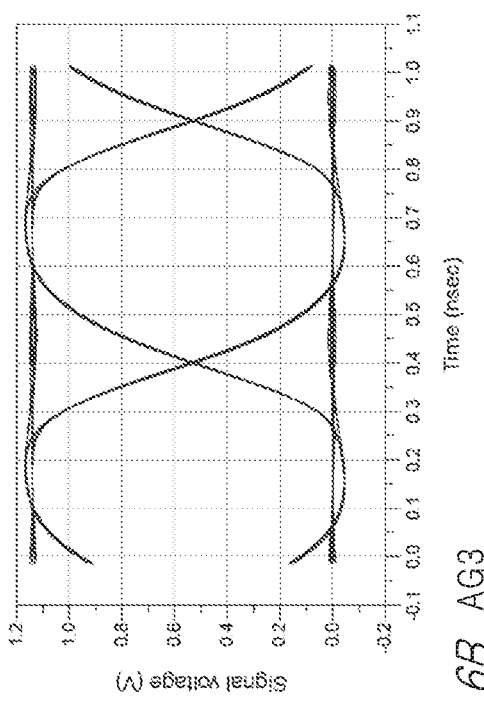
FIG. 6B AG3
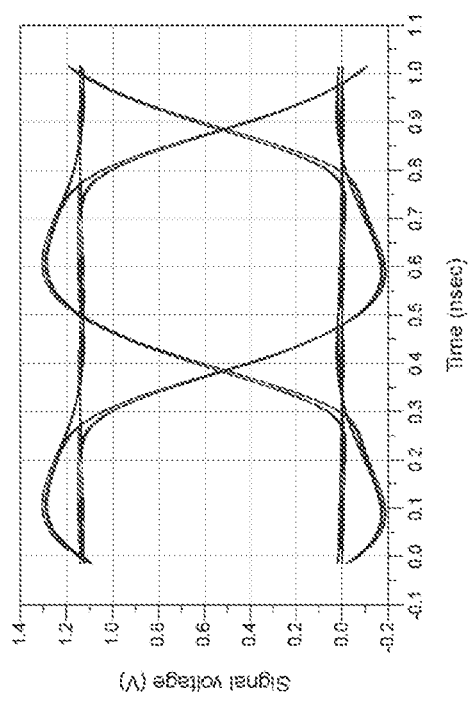
FIG. 6D AG1

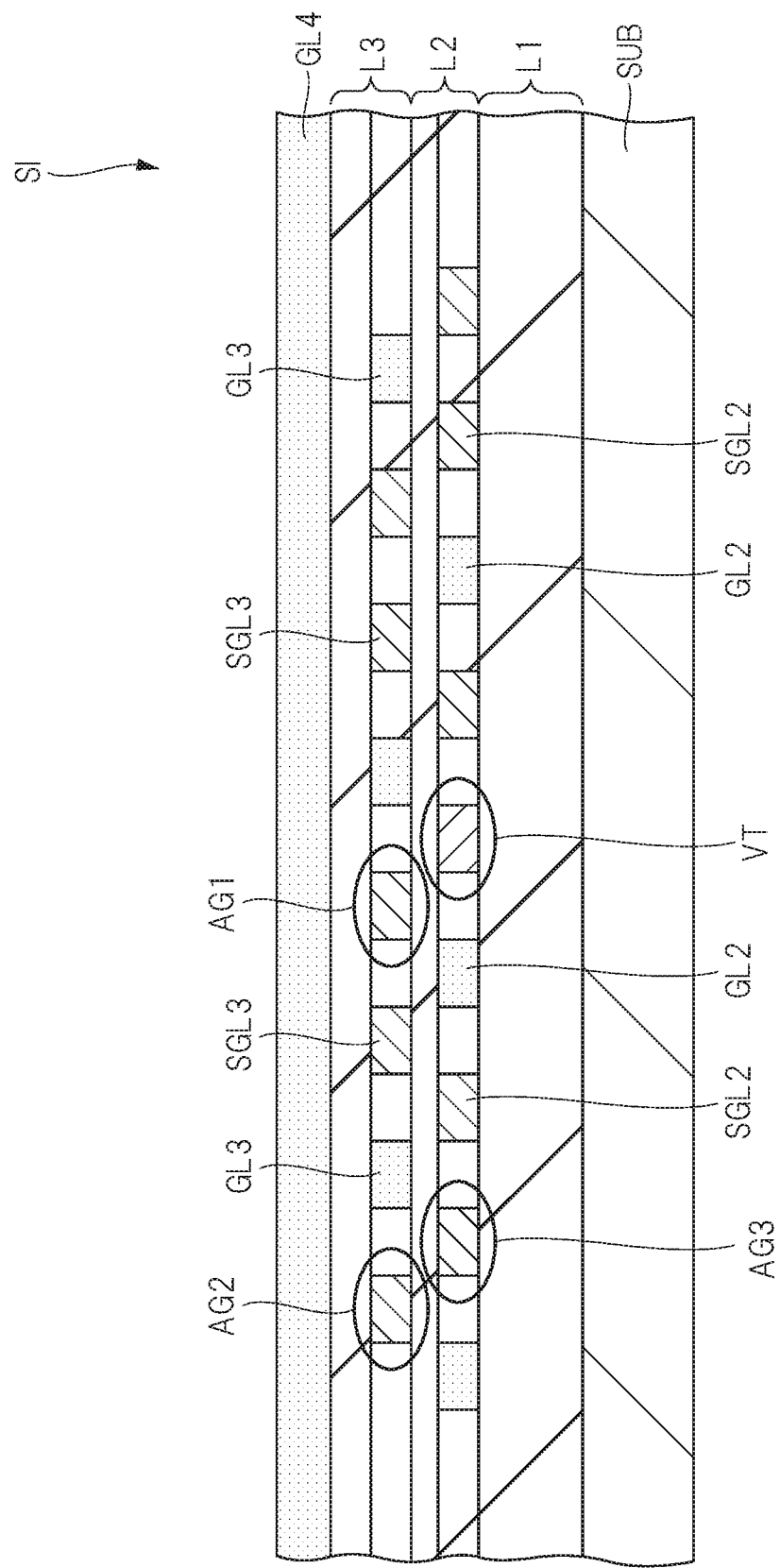

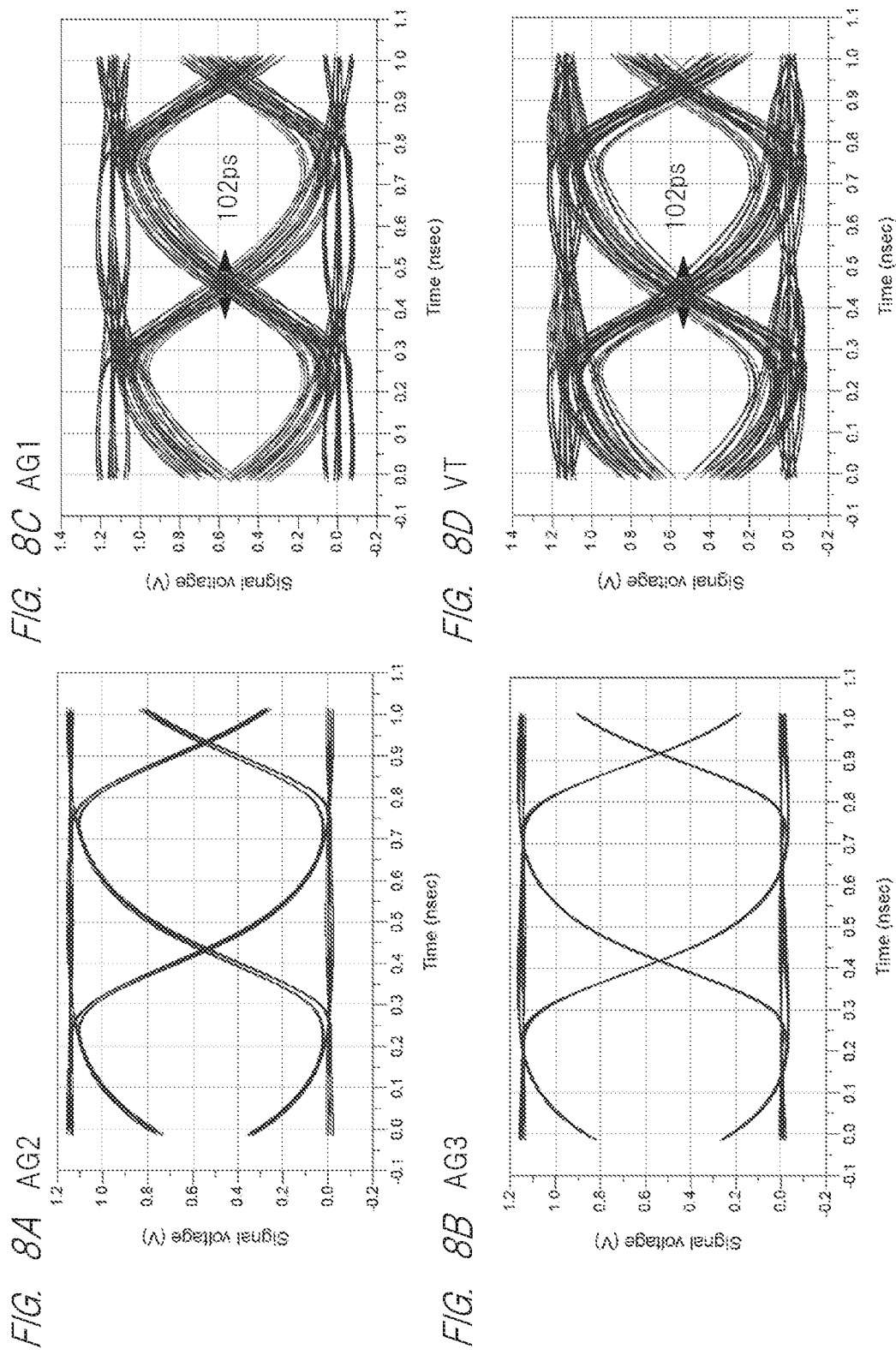

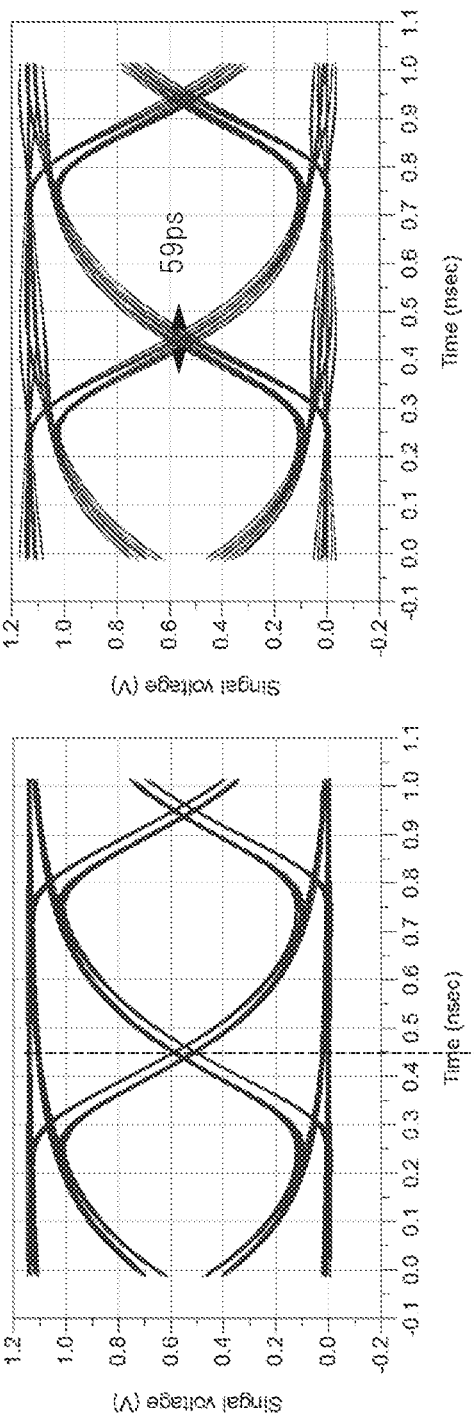
FIG. 10A AG2
FIG. 10B AG3
FIG. 10C AG1
FIG. 10D VT

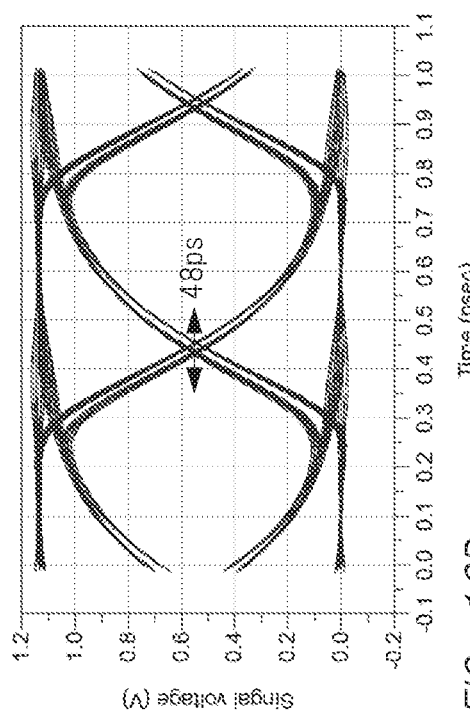
FIG. 12C AG1
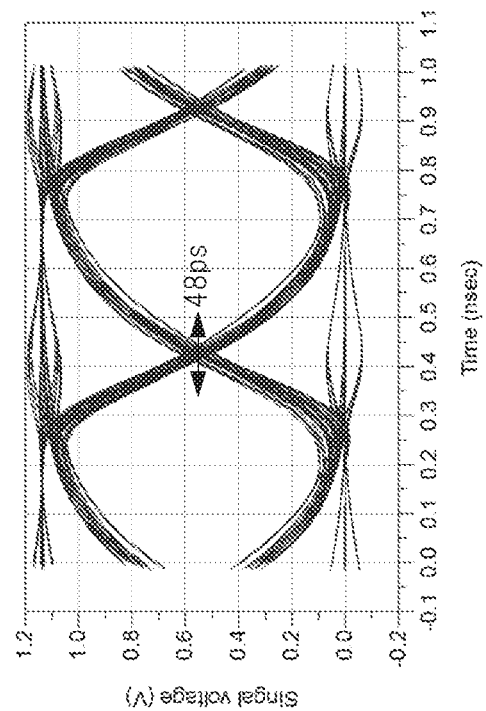
FIG. 12D VT
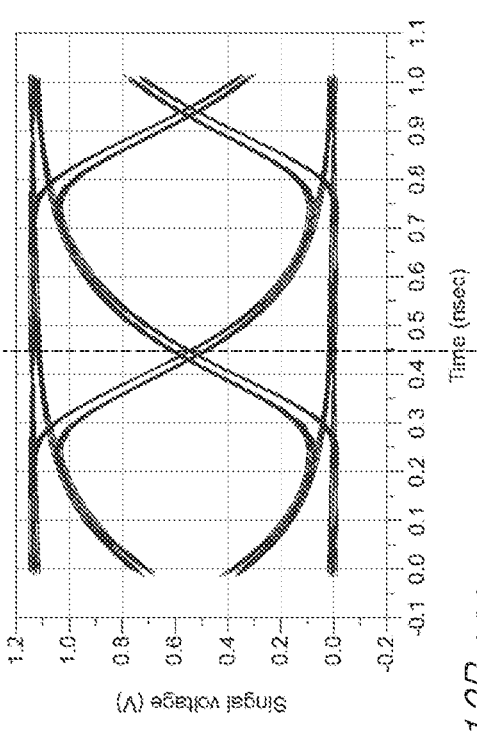
FIG. 12A AG2
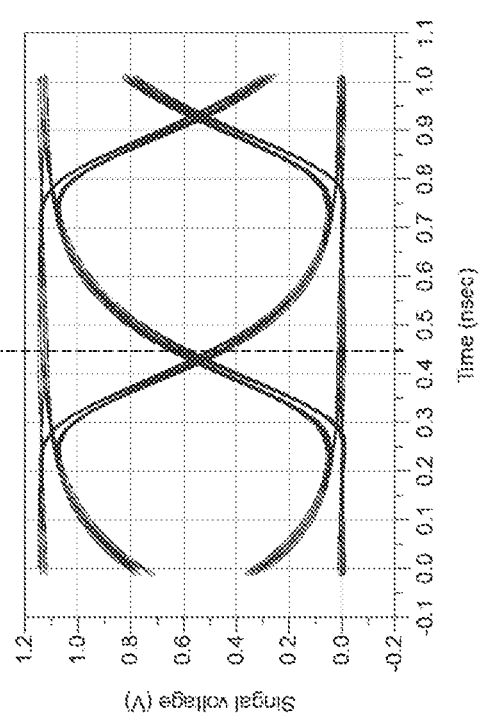
FIG. 12B AG3

W:G:Wa=1:1.6:1.5 tm :td=2:1

SEMICONDUCTOR DEVICE

CROSS-REFERENCE TO RELATED APPLICATION

The present application claims priority from Japanese Patent Application No. 2018-008133 filed on Jan. 22, 2018, the content of which is hereby incorporated by reference into this application.

TECHNICAL FIELD OF THE INVENTION

The present invention relates to a semiconductor device. For example, the present invention relates to a technique effectively applied to a semiconductor device having an interposer.

BACKGROUND OF THE INVENTION

A Patent Document 1 (International Publication No. WO/2016/103359) describes a technique for reducing a signal loss and a wiring load capacitance (parasitic capacitance) on the basis of a silicon interposer.

A Non-Patent Document 1 (W. Beyene, et al., "Signal and Power Integrity Analysis of High-Speed Links with Silicon Interposer", Proceeding of the $67^{th}$ Electronic Components and Technology Conference, 293, (2017)) describes a configuration in which a ground layer is formed among signal wirings.

SUMMARY OF THE INVENTION

For example, a semiconductor device utilizing an interposer has a memory chip on which a memory circuit is formed and a control chip on which a control circuit controlling the memory circuit is formed. And, the memory chip and the control chip are electrically connected to each other by a wiring formed in the interposer. In such a semiconductor device, it is desirable to reduce cross talk among the wirings formed in the interposer while increase in a parasitic capacitance in the wirings formed in the interposer is suppressed.

Other objects and novel characteristics will be apparent from the description of the present specification and the accompanying drawings.

A semiconductor device according to one embodiment has an interposer including a first signal wiring layer, a second reference wiring layer formed above the first signal wiring layer, and a third signal wiring layer formed above the second reference wiring layer. And, a signal wiring formed in the first signal wiring layer and a reference wiring formed in the second reference wiring layer are arranged so as to be distant from each other in a plan view. Similarly, the reference wiring formed in the second reference wiring layer and a signal wiring formed in the third signal wiring layer are arranged so as to be distant from each other in a plan view.

According to one embodiment, cross talk among the wirings formed in the interposer can be reduced while increase in the parasitic capacitance among the wirings formed in the interposer is suppressed.

BRIEF DESCRIPTIONS OF THE DRAWINGS

FIGS. 6A to 6D are diagrams each showing a calculation result of a signal transmission waveform at the time of simultaneous operation;

FIG. 7 is a schematic view showing a configuration of an interposer obtained by developing the first related technique;

FIGS. 8A to 8D are diagrams each showing a calculation result of a signal transmission waveform at the time of the simultaneous operation in the interposer obtained by developing the first related technique;

FIGS. 10A to 10D are diagrams each showing a calculation result of a signal transmission waveform at the time of simultaneous operation in the interposer according to the second related technique;

FIGS. 12A to 12D are diagrams each showing a calculation result of a signal transmission waveform at the time of simultaneous operation in the interposer according to the first embodiment;

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, the same components are denoted by the same reference symbols in principle throughout all the drawings for describing the embodiments, and the repetitive description thereof is omitted. Note that hatching may be used even in a plan view so as to make the drawings easy to see.

First Embodiment

In the present first embodiment, an aspect in which a plurality of semiconductor chips are mounted on a silicon interposer having a plurality of wiring layers formed on a silicon substrate will be cited and explained as an example of a semiconductor device in which a plurality of semiconductor components are electrically connected to one another through the interposer. Specifically, a semiconductor device cited as exemplification and explained in the present first embodiment has a memory chip on which a memory circuit is formed and a logic chip on which a control circuit controlling the memory chip and a computation processing circuit are formed. The memory chip and the logic chip are electrically connected to each other through the silicon interposer so that a system is formed in one package. Such a semiconductor device in which the system is formed in one package is called SiP (System in Package). And, a semiconductor device in which a plurality of semiconductor chips are mounted on one package is called MCM (Multi Chip Module).

<Outline of Semiconductor Device>

First, with reference to FIGS. 1 to 4, an outline of a structure of a semiconductor device according to the present embodiment will be explained.

Figure 1:
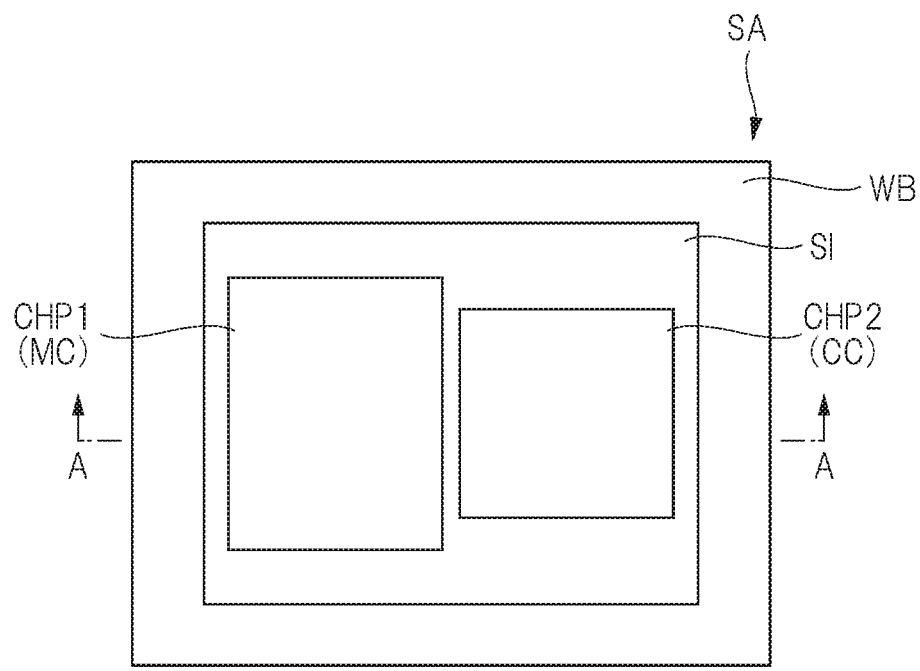
FIG. 1 is a top view of a semiconductor device according to a first embodiment.

FIG. 1 is a top view of the semiconductor device according to the present first embodiment. As shown in FIG. 1, a semiconductor device SA according to the present first embodiment has a wiring substrate WB, an interposer (relay board) SI mounted on the wiring substrate WB, a plurality of semiconductor chips CHP1 stacked and mounted on the interposer SI, and a semiconductor chip CHP2 mounted on the interposer SI so as to be distant from the plurality of semiconductor chips CHP1. In this case, the plurality of semiconductor chips CHP1 and the semiconductor chip CHP2 are arranged side by side on the interposer SI.

As shown in FIG. 1, the wiring substrate WB has a quadrangular outer shape in a plan view. Similarly, the interposer SI also has a quadrangular outer shape in a plan view. Further, each of the plurality of semiconductor chips CHP1 and the semiconductor chip CHP2 also has a quadrangular outer shape in a plan view.

In the example shown in FIG. 1, each of the plurality of semiconductor chips CHP1 is a memory chip MC having a memory circuit. On the other hand, the semiconductor chip CHP2 is a logic chip CC having a control circuit controlling the memory circuit. In this case, in the example shown in FIG. 1, each of the memory chip MC and the logic chip CC is directly connected to the interposer SI. In other words, a substrate and other chip components are not inserted between the memory chip MC and the interposer SI and between the logic chip CC and the interposer SI.

Figure 2:
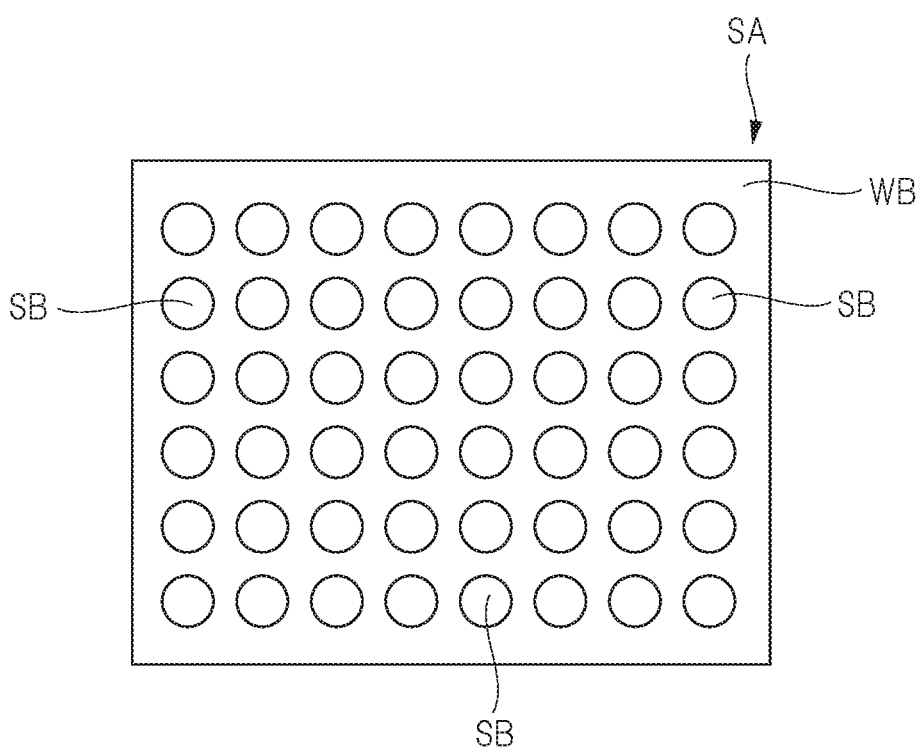
FIG. 2 is a bottom view of the semiconductor device shown in FIG. 1.

Next, FIG. 2 is a bottom view of the semiconductor device shown in FIG. 1. As shown in FIG. 2, a plurality of solder balls SB that are external terminals are arranged in a matrix form on a bottom surface of the wiring substrate WB that is a mounting surface of the semiconductor device SA. Each of the plurality of solder balls SB is connected to a land (not illustrated) formed in the wiring substrate WB.

A semiconductor device in which the plurality of solder balls SB are arranged in the matrix form on a mounting surface side, such as the semiconductor device SA, is called an area-array type semiconductor device. In the area-array type semiconductor device SA, the mounting surface (bottom surface) side of the wiring substrate WB can be effectively utilized as an arrangement space for the external terminals (solder balls SB). Therefore, the area-array type semiconductor device SA is useful because increase in a mounting area of the semiconductor device SA can be suppressed even if the number of external terminals increases. That is, even if the number of external terminals increases because of high functionality and high integration of the semiconductor device, the area-array type semiconductor device SA is excellent in that the increased external terminals can be mounted on a saving space.

Figure 3:
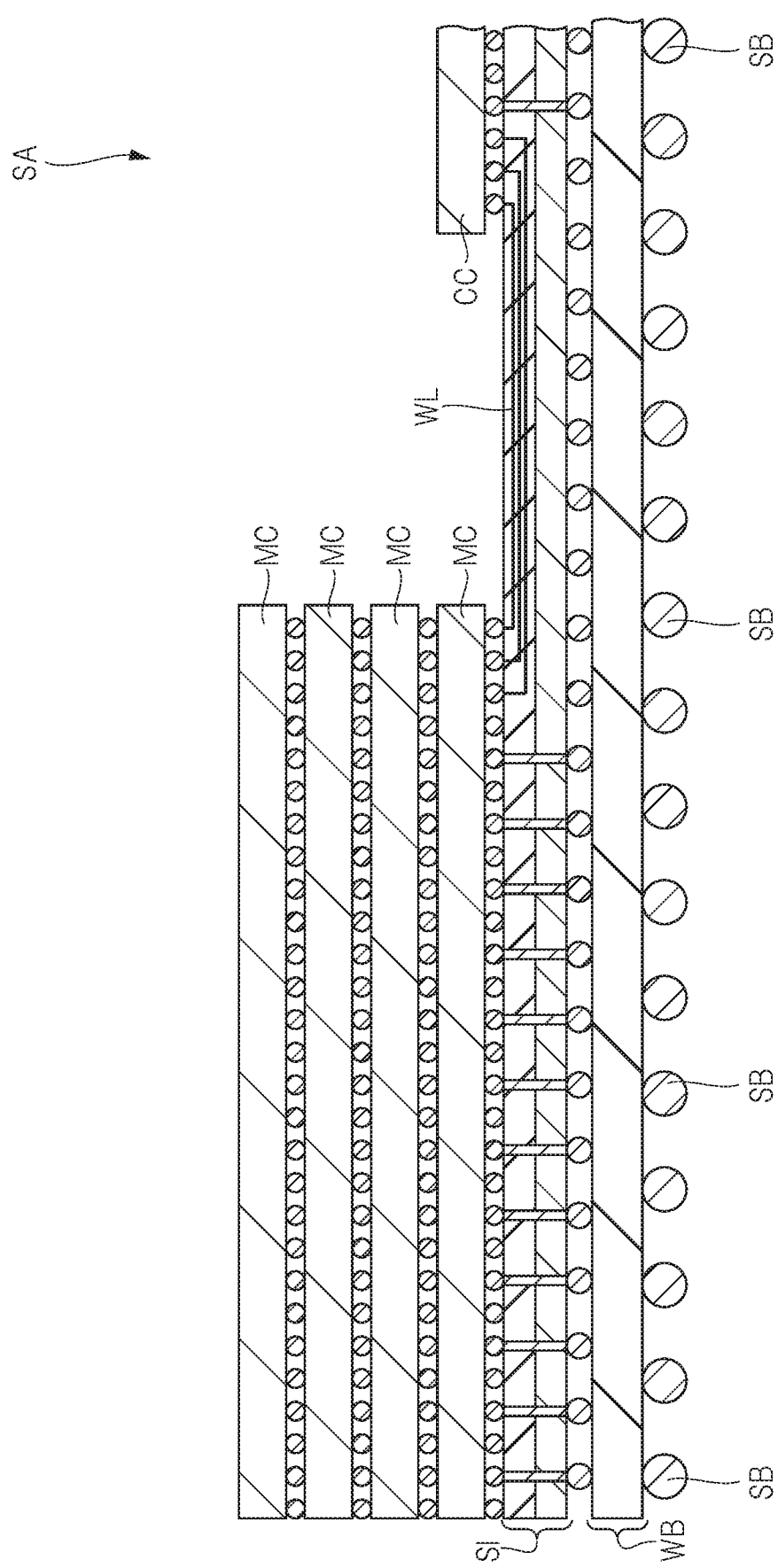
FIG. 3 is a cross-sectional view obtained by cutting a line A-A of FIG. 1.

Subsequently, FIG. 3 is a cross-sectional view obtained by cutting a line A-A of FIG. 1. In FIG. 3, the wiring substrate WB has a top surface on which the plurality of memory chips MC and the logic chip CC are mounted through the interposer SI, a bottom surface on an opposite side of the top surface, and a side surface arranged between the top surface and the bottom surface. As shown in FIG. 3, the interposer SI has a top surface on which the plurality of memory chips MC and the logic chip CC are mounted, a bottom surface on an opposite side of the top surface, and a side surface arranged between the top surface and the bottom surface. Further, as shown in FIG. 3, each of the plurality of memory chips MC has a front surface, a rear surface on an opposite side of the front surface, and a side surface arranged between the front surface and the rear surface. Similarly, the logic chip CC also has a front surface, a rear surface on an opposite side of the front surface, and a side surface arranged between the front surface and the rear surface.

The interposer SI is arranged on the top surface of the wiring substrate WB, and the plurality of memory chips MC are stacked and mounted on the top surface of the interposer SI. Also, on the top surface of the interposer SI, the logic chip CC arranged so as to be distant from the plurality of memory chips MC that are stacked is also mounted. In this case, as shown in FIG. 3, a plurality of wirings WL are formed in the interposer SI, and the plurality of memory chips MC and the logic chip CC are electrically connected to each other through the plurality of wirings WL formed in the interposer SI.

Figure 4:
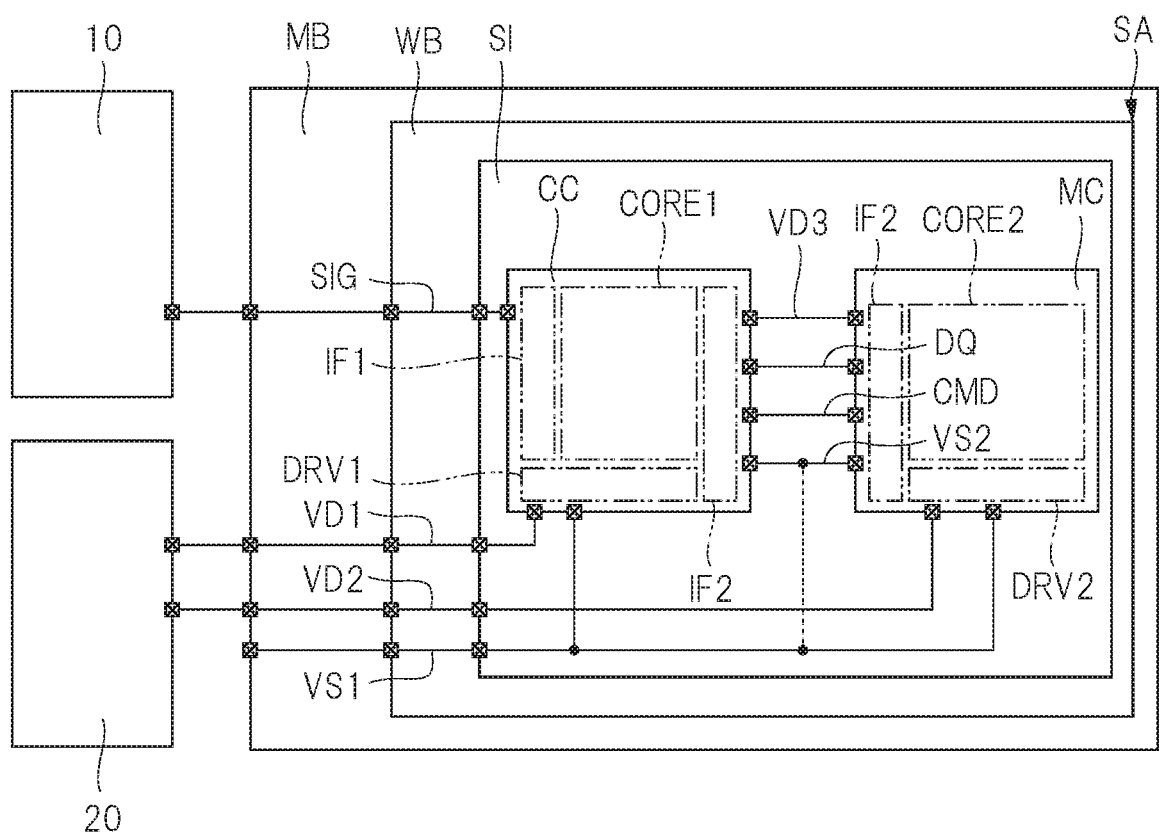
FIG. 4 is an explanatory diagram showing a circuit configuration example obtained when the semiconductor device shown in FIGS. 1 to 3 is mounted on a mounting substrate.

Next, FIG. 4 is an explanatory diagram showing a circuit configuration example obtained when the semiconductor device shown in FIGS. 1 to 3 is mounted on the mounting substrate. In FIG. 4, the semiconductor device SA mounted on the mounting substrate MB includes a system that is operated by transmission of a signal between the logic chip CC and the memory chip MC. The memory chip MC includes a main storage circuit (storage circuit) storing data that is communicated with the logic chip CC. Meanwhile, the logic chip CC includes a control circuit controlling an operation of the main storage circuit formed in the memory chip MC. Further, the logic circuit CC includes a computation processing circuit executing a computation processing to an input data signal. FIG. 4 illustrates principal circuits such as the computation processing circuit and the control circuit as a core circuit (main circuit) CORE1 as an example. However, as the circuits included in the core circuit CORE1, circuits other than the above-described circuits may be included. For example, in the logic chip CC, a supplementary storage circuit (storage circuit) having a smaller storage capacitance than that of the main storage circuit of the memory chip MC, such as a cash memory in which the data is temporarily stored, may be formed.

In the logic chip CC, an external interface circuit (input/output circuit) IF1 to/from which a signal is input/output from/to an external apparatus 10 is formed. To the external interface circuit IF1, a signal line SIG through which a signal is transmitted between the logic chip CC and the external apparatus 10 is connected. Further, to the external interface circuit IF1, the core circuit CORE1 is also connected. In this manner, the core circuit CORE1 can transmit/receive the signal to/from the external apparatus 10 through the external interface circuit IF1.

Further, in the logic chip CC, an internal interface circuit (input/output circuit) IF2 to/from which a signal is input/output from/to an internal apparatus (such as the memory chip MC) is formed. To the internal interface circuit IF2, a data line (signal line) DQ transmitting/receiving a data signal and a control signal line (signal line) CMD transmitting/receiving a control data signal such as an address signal and a command signal are connected. Each of the data line DQ and the control signal line CMD is connected to the internal interface circuit IF2 of the memory chip MC.

The logic chip CC includes a power supply circuit DRV1 supplying a potential for driving the core circuit CORE1 and the input/output circuit. In the example shown in FIG. 4, to the power supply circuit DRV1, a power supply line VD1 supplying a power supply potential and a reference potential line VS1 supplying a reference potential are connected.

Note that FIG. 4 shows an example in which a pair of the power supply line VD1 and the reference potential line VS1 is connected to the logic chip CC. However, the potential supplied to the logic chip CC is not limited to the above-described two types. For example, the power supply circuit DRV1 may include a power supply circuit for the external interface supplying a voltage for driving the external interface circuit IF1 formed in the logic chip CC and a power supply circuit for the core supplying a voltage for driving the core circuit CORE1 formed in the logic chip CC. Also, the power supply circuit DRV1 may include a power supply circuit for the internal interface supplying a voltage for driving the internal interface circuit IF2 formed in the logic chip CC. In this case, to the logic chip CC, a plurality of power supply lines VD1 supplying a plurality of power supply potentials that are different from one another are connected.

A potential supplied to the reference potential line VS1 shown in FIG. 4 is, for example, a ground potential. However, the driving voltage is defined by a difference between a first potential and a second potential that are different from each other, and therefore, the potential supplied to the reference potential line VS1 may be a potential other than the ground potential.

A component such as the logic chip CC in which circuits required for operations of a certain device and system are collectively formed on one semiconductor chip is called SoC (System on a Chip). In this case, when the main storage circuit shown in FIG. 4 is formed on the logic chip CC, the system can be configured of only the logic chip CC. However, a required capacitance of the main storage circuit depends on the operated device and system. Accordingly, by the formation of the main storage circuit on the memory chip MC that is different from the logic chip CC, general versatility of the logic chip CC can be improved. And, by connection of a plurality of memory chips MC in accordance with the required storage capacitance of the main storage circuit, flexibility in the design of the capacitance of the storage circuit included in the system can be improved.

In the example shown in FIG. 4, the memory chip MC includes the main storage circuit. FIG. 4 shows the main storage circuit as a core circuit (main circuit) CORE2 of the memory chip MC. However, circuits included in the core circuit CORE2 may include a circuit other than the main storage circuit.

On the memory chip MC, an internal interface circuit (internal input/output circuit) IF2 to/from which a signal is input/output from/to an internal apparatus (such as the logic chip CC) is formed.

The memory chip MC includes a power supply circuit (driving circuit) DRV2 supplying a potential for driving the core circuit CORE2. In the example shown in FIG. 4, to the power supply circuit DRV2, a power supply line VD2 supplying a power supply potential and a reference potential line VS1 supplying a reference potential are connected. In the example shown in FIG. 4, each of a power supply potential supplied to the power supply line VD1 and a power supply potential supplied to the power supply line VD2 is supplied from a power supply 20 arranged on an outside of the semiconductor device SA.

Note that FIG. 4 shows an example in which a pair of the power supply line VD2 and the reference potential line VS1 is connected to the memory chip MC. In the example shown in FIG. 4, the logic chip CC and the memory chip MC are electrically connected to each other through each of the power supply line VD3 supplying the power supply potential for driving the internal interface circuit IF2 and the reference potential line VS2. However, a method of supplying the potential to the memory chip MC has various modification examples other than the above-described methods. For example, the power supply potential for driving the internal interface circuit IF2 of the logic chip CC and the power supply potential for driving the internal interface circuit IF2 of the memory chip MC may be independently supplied. In this case, the power supply 20 and the memory chip MC shown in FIG. 4 are electrically connected to each other through the power supply line VD3.

In the example shown in FIG. 4, a plurality of transmission paths by which the logic chip CC and the memory chip MC are electrically connected to each other include not only the data line DQ and the control signal line CMD but also the reference potential line VS2. The reference potential line VS2 is, for example, a transmission path for a reference signal of the data signal that is transmitted through the data lien DQ. To the reference potential line VS2 for the reference, for example, the ground potential is supplied as a reference potential. When the ground potential is supplied to each of the reference potential line VS2 and the reference potential line VS1, the potential becomes stable by connection between the reference potential line VS2 and the reference potential line VS1. Therefore, as shown with a dot line in FIG. 4, it is desirable to connect the reference potential line VS2 and the reference potential line VS1 at the interposer SI. However, if variation in the potential in the transmission path can be reduced, a potential other than the ground potential may be supplied to the reference potential line VS2 for the reference. For example, a power supply potential of the power supply circuit for the input/output may be used as the reference potential for the reference.

In the example shown in FIG. 4, each of the power supply line VD2 supplying the power supply potential to the memory chip MC and the reference potential line VS1 supplying the reference potential to the memory chip MC is connected to the memory chip MC without through the logic chip CC. However, as a modification example of FIG. 4, the power supply line VD2 and the reference potential line VS1 may be connected to the memory chip MC through the logic chip CC.

<Studies on Improvement>

For example, as shown in FIG. 3, the memory chip MC and the logic chip CC are electrically connected to each other by using the wiring WL formed in the interposer SI. In order to improve a performance of the semiconductor device having the configuration in which the memory chip MC and the logic chip CC are electrically connected to each other through the wirings WL formed in the interposer SI as described above, it is essential to reduce the cross talk among the wirings WL formed in the interposer SI while increase in a parasitic capacitance among the wirings WL formed in the interposer SI is suppressed. Therefore, techniques related to the interposer will be explained first, and then, it will be explained that the related techniques are insufficient for reducing the cross talk among the wirings formed in the interposer while the increase in the parasitic capacitance among the wirings formed in the interposer is suppressed. That is, it will be explained that the related techniques have a room for the improvement from a viewpoint of the reduction of the cross talk among the wirings formed in the interposer while the increase in the parasitic capacitance among the wirings formed in the interposer is suppressed. Then, a technical concept of the present first embodiment that has developed the room for the improvement in the related techniques will be explained. Note that the "related technique" described in the present specification is a technique having problems that have been newly found by the inventor, which is not a publicly-known conventional technique, but a technique described as a premise technique (not publicly-known technique) of a new technical concept.

<<Explanation for First Related Technique>>

Figure 5:
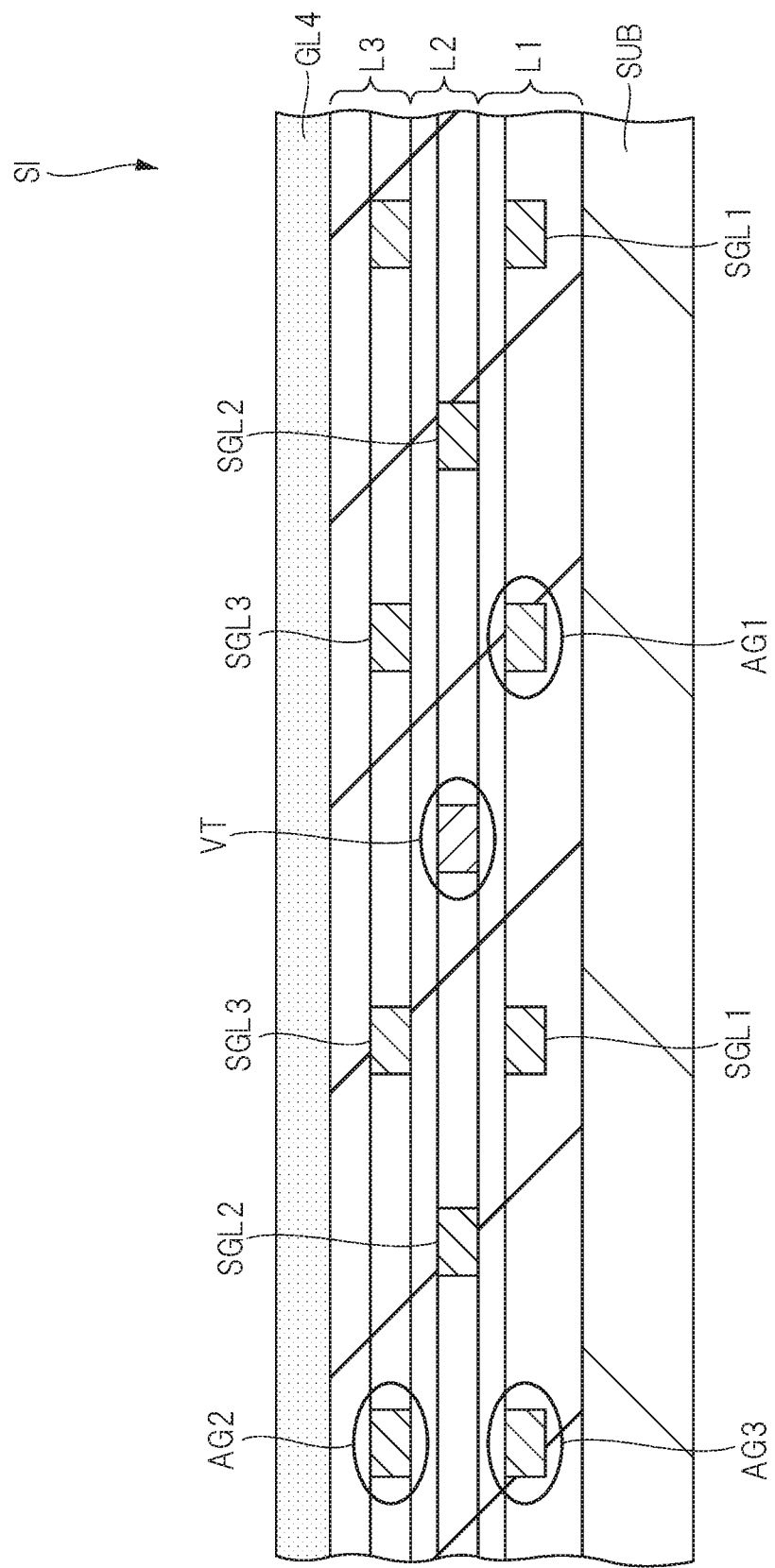
FIG. 5 is a cross-sectional view showing a schematic configuration of an interposer according to a first related technique.

FIG. 5 is a cross-sectional view showing a schematic configuration of an interposer SI of the first related technique. In FIG. 5, in the interposer SI of the first related technique, for example, a wiring layer L1 is formed on a substrate SUB made of silicon. And, on this wiring layer L1, a wiring layer L2 is formed. Further, on this wiring layer L2, a wiring layer L3 is formed.

As shown in FIG. 5, a plurality of signal wirings SGL1 are formed in the wiring layer L1. And, a plurality of signal wirings SGL2 are formed in the wiring layer L2. Similarly, a plurality of signal wirings SGL3 are formed in the wiring layer L3. On the wiring layer L3, for example, a reference wiring GL4 to which a reference potential (DC potential) is supplied is formed.

In the interposer SI of the first related technique configured as described above, a signal loss due to the substrate SUB made of a semiconductor material (silicon) can be reduced. For example, when the semiconductor device is operated, a signal is transmitted through the signal wirings SGL1 to SGL3. When the signal is transmitted through the signal wirings SGL1 to SGL3, an induced current that is induced by this signal flows through the substrate SUB made of silicon. At this time, a resistivity of the substrate SUB made of silicon is relatively high. Therefore, when the induced current flows through the substrate SUB, a signal loss due to a Joule heat is large. However, in the first related technique shown in FIG. 5, the reference wiring GL4 to which the reference potential (DC potential) is supplied is formed on the wiring layer L3. In this case, the induced current that has been induced by the signal flowing through the signal wirings SGL1 to SGL3 flows through not only the substrate SUB made of silicon but also the reference wiring GL4. The reference wiring GL4 is made of, for example, a metal material (such as aluminum) having a lower resistivity than that of a semiconductor material. And, the induced current preferentially flows through a structure body having a low resistivity. Consequently, the induced current induced by the signal flowing through the signal wirings SGL1 to SGL3 preferentially flows through the reference wiring GL4. Because of this fact, in the first related technique, the induced current flowing through the substrate SUB having a high resistivity is relatively reduced, and therefore, the signal loss in the substrate SUB made of silicon can be reduced.

The formation of, on the wiring layer L3, the reference wiring GL4 to which the reference potential (DC potential) is supplied, means that the reference wiring GL4 is formed closer to the memory chip and the logic chip mounted on the interposer SI. This means that a wiring length of the reference wiring GL4 electrically connected to the memory chip and the logic chip is short. The reference wiring GL4 to which the reference potential (DC potential) is supplied functions as a main return current path (induced current path). Therefore, the first related technique shown in FIG. 5 has a merit of reducing a parasitic impedance of the feedback current path.

Further, in the first related technique shown in FIG. 5, a distance between the signal wiring SGL3 and the reference wiring GL4 is larger than a distance between the signal wiring SGL1 and the signal wiring SGL2 and a distance between the signal wiring SGL2 and the signal wiring SGL3. Consequently, in the first related technique, the parasitic capacitance between each of the signal wirings SGL1 to SGL3 and the reference wiring GL4 can be suppressed. In the first related technique, the signal wirings SGL1 to SGL3 are alternately arranged, and therefore, inter-signal interference and the parasitic capacitance among the signal wirings SGL1 to SGL3 can be also reduced.

Because of the above description, according to the first related technique shown in FIG. 5, the interposer SI having a favorable signal transmission property can be provided.

<<Room for Improvement Existing in First Related Technique>>

However, in recent years, it has been desirable to improve a signal transmission speed between the memory chip and the logic chip through the interposer. In an attempt to improve the signal transmission speed, in order to maintain the favorable signal transmission property, it is desirable to improve a driving performance of the I/O circuit (input/output circuit) formed on the memory chip and the logic chip. In other words, the present inventor has newly found that the signal transmission property is significantly deteriorated in the attempt to improve the signal transmission speed without sufficiently improving the driving performance of the I/O circuit (input/output circuit) formed on the memory chip and the logic chip. That is, this is because, when the I/O circuit having a relatively low driving performance is used, it takes time to rise/fall a signal, which results in occurrence of the inter-signal interference in a long time. In other words, when the I/O circuit having a relatively low driving performance is used, the cross talk tends to largely affect, and, as a result, the deterioration of the signal transmission property appears.

For example, FIGS. 6A to 6D are diagrams each showing a calculation result of a signal transmission waveform at the time of simultaneous operation. The simultaneous operation means that signals applied to all other signal wirings except for one signal wiring that is a "victim" signal wiring are simultaneously turned on/off. Specifically, in FIG. 5, the simultaneous operation is an operation of simultaneously turning on/off signals that are applied to all other signal wirings SGL1 to SGL3 including signal wirings AG1 to AG3 except for a "victim" signal wiring VT. In this case, FIG. 6A is a diagram showing a signal transmission waveform of the signal applied to the signal wiring AG2, and FIG. 6B is a diagram showing a signal transmission waveform of the signal applied to the signal wiring AG3. Meanwhile, FIG. 6C is a diagram showing a signal transmission waveform of the signal applied to the signal wiring VT, and FIG. 6D is a diagram showing a signal transmission waveform of the signal applied to the signal wiring AG1. As shown in FIGS. 6A to 6D, it is found that, at the time of the simultaneous operation, the signal wiring VT is largely influenced by the cross talk from other signal wirings so that the signal transmission waveform shown in FIG. 6C significantly deteriorates. Therefore, the first related technique has the room for the improvement from the viewpoint of obtaining the favorable signal transmission waveform of the signal wiring VT at the time of the simultaneous operation.

<<Development of First Related Technique>>

Accordingly, the present inventor has studied the development of the above-described first related technique. FIG. 7 is a schematic view showing a configuration of an interposer obtained by developing the first related technique. In FIG. 7, in the interposer SI obtained by developing the first related technique, the reference wiring GL2 to which the reference potential is supplied is arranged between the plurality of signal wirings SGL2, and the reference wiring GL3 to which the reference potential is supplied is arranged between the plurality of signal wirings SGL3 as well. In this manner, it is conceivable that the signal wirings SGL2 and the signal wirings SGL3 function as shields for suppressing the cross talk among the signal wirings, and, as a result, the cross talk among the signal wirings can be reduced.

FIGS. 8A to 8D are diagrams each showing a calculation result of a signal transmission waveform at the time of the simultaneous operation in the interposer SI obtained by practically developing the first related technique. Particularly, FIG. 8A is a diagram showing a signal transmission waveform of the signal applied to the signal wiring AG2, and FIG. 8B is a diagram showing a signal transmission waveform of the signal applied to the signal wiring AG3. Meanwhile, FIG. 8C is a diagram showing a signal transmission waveform of the signal applied to the signal wiring AG1, and FIG. 8D is a diagram showing a signal transmission waveform of the signal applied to the signal wiring VT. As shown in FIGS. 8A to 8D, in the interposer SI obtained by developing the first related technique, the signal transmission waveform of the signal applied to the signal wiring VT is improved. However, for example, when a timing shift (jitter) of about 50 ps is a target, it cannot be said yet that the improvement is sufficient.

As described above, even the developed technique of the first related technique is insufficient for a countermeasure for obtaining the favorable signal transmission waveform of the signal wiring VT at the time of the simultaneous operation.

<<Studies on Second Related Technique>>

Figure 9:
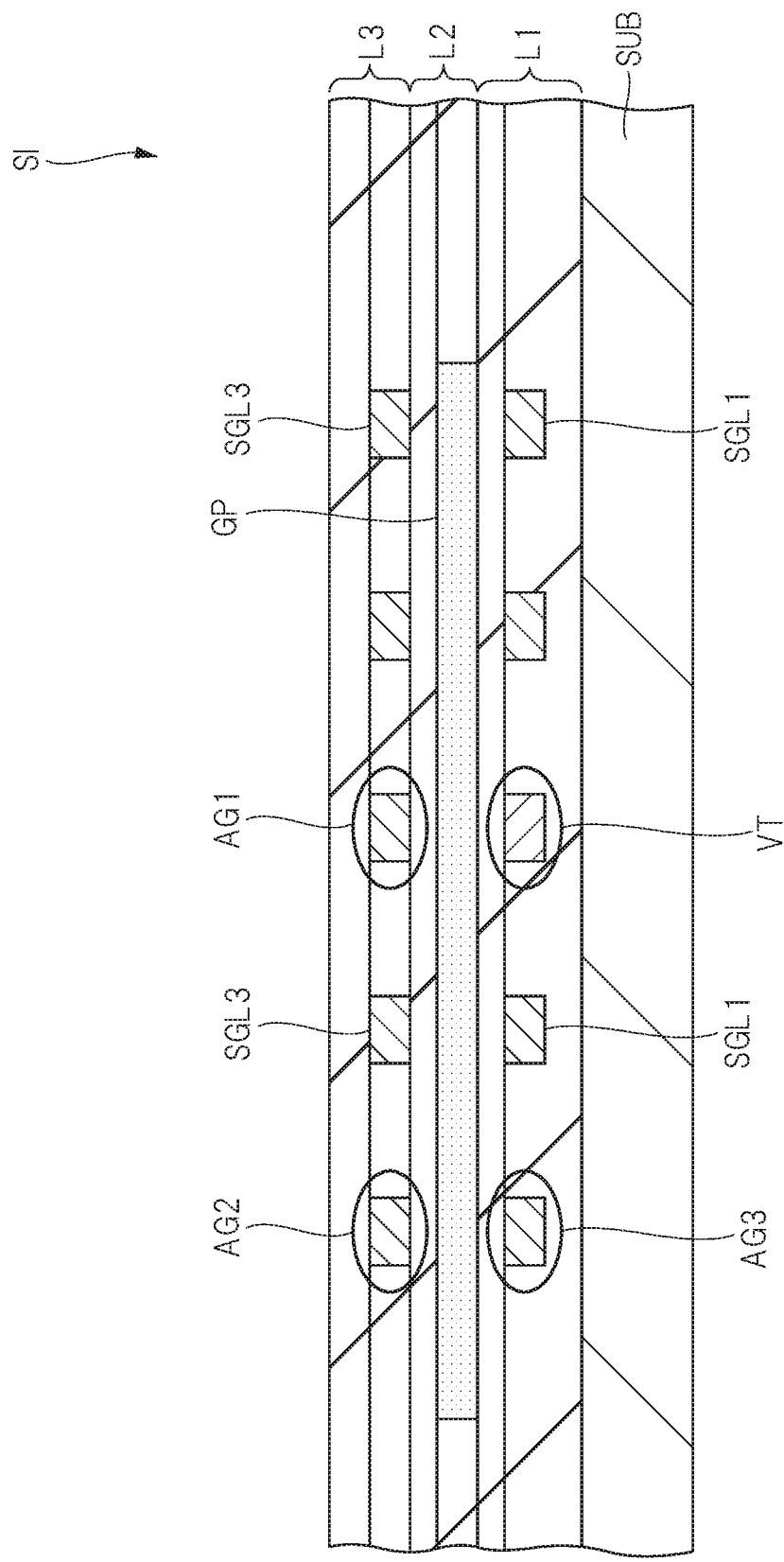
FIG. 9 is a schematic view showing a configuration of an interposer according to a second related technique.

Next, the second related technique studied by the present inventor will be explained. FIG. 9 is a schematic view showing a configuration of an interposer of the second related technique studied by the present inventor. In the second related technique shown in FIG. 9, a ground pattern GP to which the reference potential is supplied is arranged in a wiring layer L2 between a wiring layer L1 in which the signal wiring SGL1 is formed and a wiring layer L3 in which the signal wiring SGL3 is formed. In the interposer SI of the second related technique configured as described above, the signal wiring SGL1 and the signal wiring SGL3 can be distant from each other, and the ground pattern GP functions as a shield for reducing the cross talk between the signal wiring SGL1 and the signal wiring SGL3. Therefore, it is conceivable that the cross talk between the signal wiring SGL1 and the signal wiring SGL3 can be reduced by the second related technique.

FIGS. 10A to 10D are diagrams each showing a practical calculation result of a signal transmission waveform at the time of the simultaneous operation in the interposer SI of the second related technique. Particularly, FIG. 10A is a diagram showing a signal transmission waveform of the signal applied to the signal wiring AG2, and FIG. 10B is a diagram showing a signal transmission waveform of the signal applied to the signal wiring AG3. Meanwhile, FIG. 10C is a diagram showing a signal transmission waveform of the signal applied to the signal wiring AG1, and FIG. 10D is a diagram showing a signal transmission waveform of the signal applied to the signal wiring VT. As shown in FIGS. 10A to 10D, in the interposer SI of the second related technique, it is found that the signal transmission waveform of the signal applied to the signal wiring VT is significantly improved. However, as shown in FIGS. 10A to 10C, it is found that the signal transmission waveforms of the signals applied to the signal wirings represented by the signal wirings AG1 to AG3 having the small crosstalk influence deteriorate. This is because, although the cross talk is reduced by the ground pattern GP added to the wiring layer L2 for reducing the cross talk, the parasitic capacitance (wiring load capacitance) increases to increase a so-called RC time constant that is a product of a resistance and a capacitance. Particularly, the substrate SUB of the interposer SI is made of silicon that is the semiconductor material, and therefore, the resistivity of the interposer SI is high. In this case, even by the slight increase in the parasitic capacitance, the RC time constant is undesirably increased. From this fact, the interposer SI has large needs for suppression of the increase in the parasitic capacitance. Further, when attention is paid in FIG. 9 to the signal wiring AG2 and the signal wiring AG3 that are arranged so as to be symmetrical to each other across the ground patter GP formed in the wiring layer L2, "skew" that causes positional shift of an intersection (center point) between the rising and the falling of the signal transmission waveform occurs as shown in FIGS. 10A and 10B. That is, in the second related technique, upper and lower signal transmission properties across the ground patter GP are asymmetrical to each other, which results in occurrence of the "skew" (see a broken line). In this case, as the result of the difference between the upper and lower signal transmission properties across the ground patter GP, it is difficult to transmit a signal of the same channel to upper and lower signal wirings across the ground pattern GP.

From the above description, it is found that the above-described second related technique can reduce the cross talk but undesirably causes sub effects such as the increase in the parasitic capacitance (wiring load capacitance) and the occurrence of the "skew". Therefore, it is found that new development is required in order to reduce the cross talk among the signal wirings while the increase in the parasitic capacitance and the occurrence of the "skew" are suppressed. Accordingly, in the present first embodiment, such a development for reducing the cross talk among the signal wirings while the increase in the parasitic capacitance and the occurrence of the "skew" are suppressed has been made. A technical concept of the present first embodiment in which this development has been made will be explained below with reference to drawings.

<Configuration of Interposer According to First Embodiment>

Figure 11A:
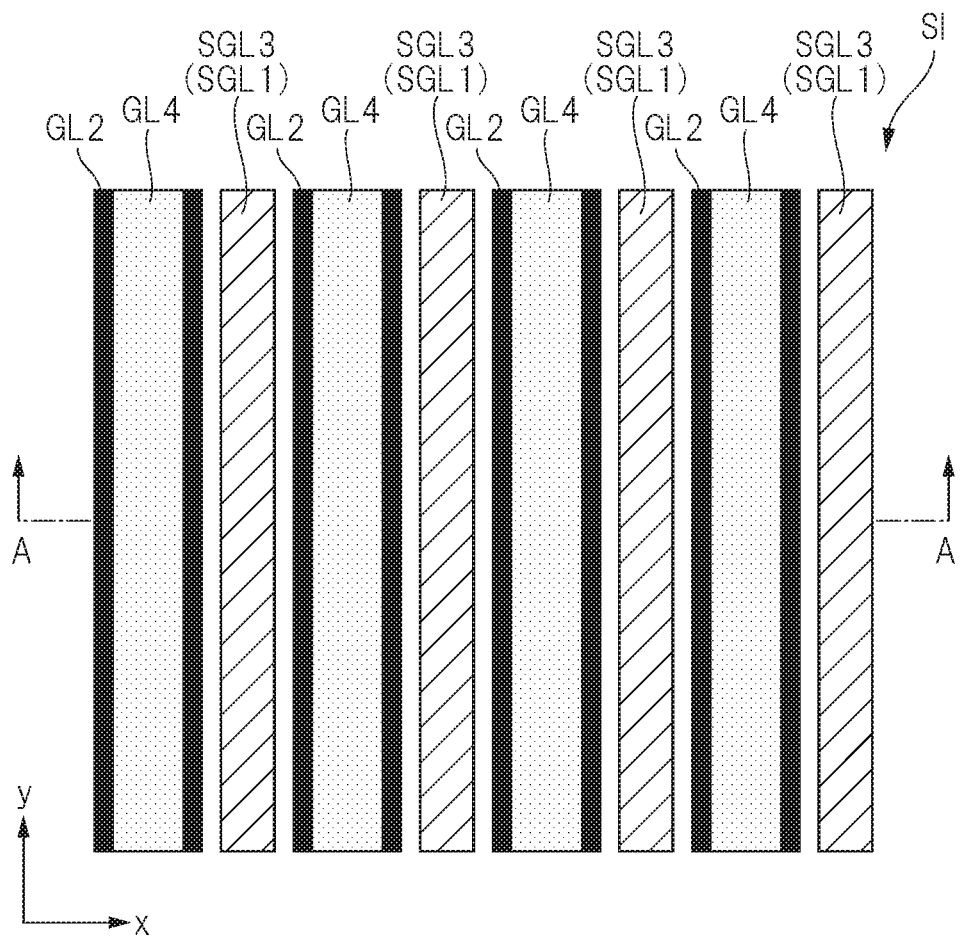
FIGS. 11A and 11B are a plan view showing a schematic configuration of the interposer according to the first embodiment and a cross-sectional view obtained by cutting a line A-A of FIG. 11A, respectively.
Figure 11B:
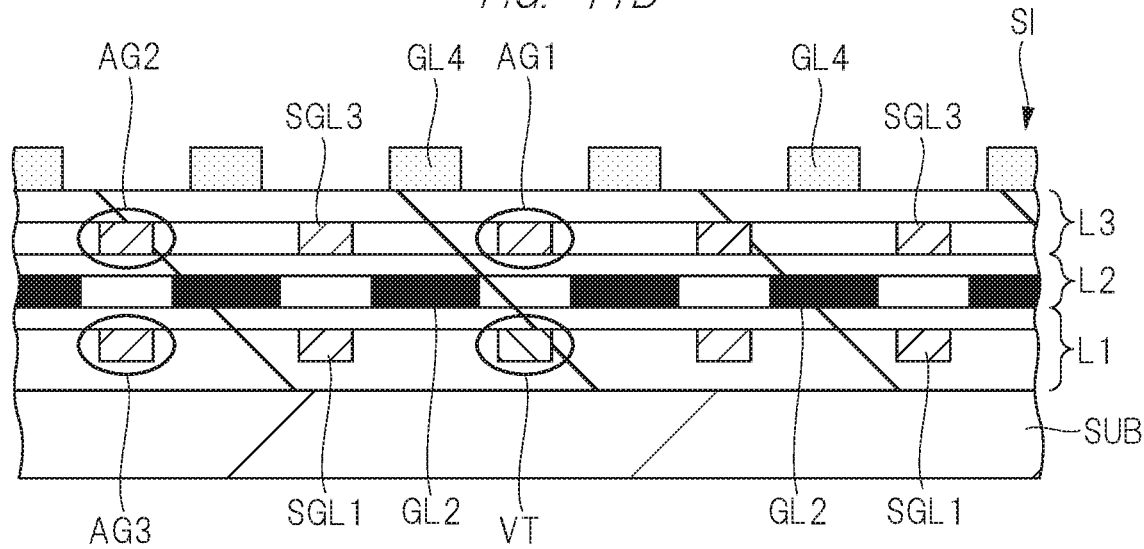

FIGS. 11A and 11B are drawings each showing a schematic configuration of the interposer according to the present first embodiment. FIGS. 11A and 11B are a plan view showing the schematic configuration of the interposer according to the present first embodiment and a cross-sectional view obtained by cutting a line A-A of FIG. 11A, respectively.

First, as shown in FIG. 11A, the signal wiring SGL1 and the signal wiring SGL3 extend in a "y" direction while overlapping each other in a plan view. And, the signal wirings SGL3 (SGL1) extending in the "y" direction are arranged side by side with a predetermined distance in an "x" direction. Further, the reference wiring GL2 extending in the y direction is arranged so as to be sandwiched by the signal wirings SGL3 (SGL1), and the reference wiring GL4 extending in the y direction is arranged so as to overlap this reference wiring GL2 in a plan view. At this time, the reference wirings GL2 (GL4) and the signal wirings SGL3 (SGL1) are arranged so as not to overlap each other in a plan view.

Next, in FIG. 11B, the interposer SI has, for example, the substrate SUB made of silicon, and a wiring layer L1 is formed on a wiring layer L2. And, the wiring layer L2 is formed on the wiring layer L1, and a wiring layer L3 is formed on the wiring layer L2. In the wiring layer L1, a plurality of signal wirings SGL1 are formed. Subsequently, in the wiring layer L2, a plurality of reference wirings GL2 are formed. Each of the plurality of reference wirings GL2 is arranged so as not to overlap the signal wiring SGL1 in a plan view. In other words, the signal wiring SGL1 is arranged so as to be included in a space between the adjacent reference wirings GL2. Next, in the wiring layer L3, a plurality of signal wirings SGL3 are formed. Each of the plurality of signal wirings SGL3 is arranged so as not to overlap the reference wiring GL2 in a plan view but so as to overlap the signal wiring SGL1 in a plan view. On the wiring layer L3, a plurality of reference wirings GL4 are formed. Each of the plurality of reference wirings GL4 is arranged so as not to overlap the signal wiring SGL1 and the signal wiring SGL3 in a plan view but so as to overlap the reference wiring GL2 in a plan view.

As described above, the interposer SI of the present first embodiment has the substrate (base member) SUB containing a semiconductor material represented by silicon as a main body, and the plurality of wiring layers formed on the substrate SUB. In this case, the plurality of wiring layers include the wiring layer L1, the wiring layer L2 formed above the wiring layer L1, and the wiring layer L3 formed above the wiring layer L2. The plurality of signal wirings SGL1 are formed in the wiring layer L1, and the plurality of reference wirings GL2 are formed in the wiring layer L2. Further, the plurality of signal wirings SGL3 are formed in the wiring layer L3.

In this case, as shown in FIG. 11A, the plurality of signal wirings SGL1 and the plurality of reference wirings GL2 are arranged so as to be distant from each other in a plan view, and the plurality of reference wirings GL2 and the plurality of signal wirings SGL3 are arranged so as to be distant from each other in a plan view.

In further detailed explanation, as shown in FIG. 11A, the plurality of reference wirings GL2 are arranged so as to sandwich a space therebetween in a plan view. Each of the plurality of reference wirings GL2 extends in the y direction. In this case, a width of the space in the x direction that is orthogonal to the y direction is smaller than a wavelength of an electromagnetic wave that transmits the signal wiring SGL1 and smaller than a wavelength of an electromagnetic wave that transmits the signal wiring SGL3.

Subsequently, as shown in FIG. 11B, when attention is paid to a positional relation between one signal wiring SGL1 of the plurality of signal wirings SGL1 and one reference wiring GL2 of the plurality of signal wirings SGL2, the one reference wiring GL2 being the closest to one signal wiring SGL1, the shortest distance between the one signal wiring SGL1 and the one reference wiring GL2 is a distance between their edges.

Next, the interposer SI of the present first embodiment further has a wiring layer formed above the wiring layer L3, and a plurality of reference wirings GL4 are formed in this wiring layer. The memory chip MC and the logic chip CC shown in FIG. 3 are further electrically connected to each other through the plurality of reference wirings GL4. In this case, as shown in FIG. 11A, the plurality of signal wirings SGL1 and the plurality of reference wirings GL4 are arranged so as to be distant from each other in a plan view, and the plurality of signal wirings SGL3 and the plurality of reference wirings GL4 are arranged so as to be distant from each other in a plan view. Further, the plurality of reference wirings GL2 and the plurality of reference wirings GL4 are arranged so as to have an overlapping portion in a plan view. When attention is paid to a positional relation between, for example, one signal wiring SGL3 of the plurality of signal wirings SGL3 and one reference wiring GL4 of the plurality of reference wirings GL4, the one reference wiring GL4 being the closest to one signal wiring SGL3, the shortest distance between the one signal wiring SGL3 and the one reference wiring GL4 is a distance between their edges.

Subsequently, as shown in FIG. 11B, the wiring layer L1 includes a first interlayer insulating layer, the wiring layer L2 includes a second interlayer insulating layer, and the wiring layer L3 includes a third interlayer insulating layer. In this case, a thickness of the third interlayer insulating layer is larger than a thickness of the first interlayer insulating layer and larger than a thickness of the second interlayer insulating layer.

Further, in the interposer SI of the present first embodiment, each of the plurality of signal wirings SGL1 is formed of a copper wiring, and each of the plurality of reference wirings GL2 is also formed of a copper wiring. While each of the plurality of signal wirings SGL3 is also formed of a copper wiring, each of the plurality of reference wirings GL4 is formed of an aluminum wiring.

<Feature of First Embodiment>

As shown in, for example, FIGS. 11A and 11B, a first feature of the present first embodiment shows that each of the plurality of reference wirings GL2 does not overlap each of the plurality of signal wirings SGL1 (SGL3) in a plan view. In other words, as shown in, for example, FIGS. 11A and 11B, a first feature of the present first embodiment shows that each of the plurality of reference wirings GL2 is distant from each of the signal wirings SGL1 (SGL3) in a plan view. In this manner, a parasitic capacitance generated between the reference wiring GL2 and the signal wiring SGL1 (SGL3) can be reduced. This is because the parasitic capacitance generated between the reference wiring GL2 and the signal wiring SGL1 (SGL3) is larger as a planar overlapping degree between the reference wiring GL2 and the signal wiring SGL1 (SGL3) is larger. That is, this is because the reference wiring GL2 is distant from the signal wiring SGL1 (SGL3) in a plan view according to the first feature of the present first embodiment, and this means that there is no planar overlapping between the reference wiring GL2 and the signal wiring SGL1 (SGL3). Further, the parasitic capacitance generated between the reference wiring GL2 and the signal wiring SGL1 (SGL3) is inversely proportional to the shortest distance between the reference wiring GL2 and the signal wiring SGL1 (SGL3). Regarding this point, when there is the planar overlapping between the reference wiring GL2 and the signal wiring SGL1 (SGL3), the shortest distance between the reference wiring GL2 and the signal wiring SGL1 (SGL3) is a layer interval between the reference wiring GL2 and the signal wiring SGL1 (SGL3). On the other hand, when the first feature of the present first embodiment is applied, there is no planar overlapping between the reference wiring GL2 and the signal wiring SGL1 (SGL3). As a result, the shortest distance between the reference wiring GL2 and the signal wiring SGL1 (SGL3) is an inter-edge distance the reference wiring GL2 and the signal wiring SGL1 (SGL3), which is larger than the layer interval between the reference wiring GL2 and the signal wiring SGL1 (SGL3). This means that, considering that the parasitic capacitance generated between the reference wiring GL2 and the signal wiring SGL1 (SGL3) is inversely proportional to the shortest distance between the reference wiring GL2 and the signal wiring SGL1 (SGL3), the parasitic capacitance generated between the reference wiring GL2 and the signal wiring SGL1 (SGL3) is reduced by the application of the first feature of the present first embodiment. That is, according to the first feature of the present first embodiment, the parasitic capacitance generated between the reference wiring GL2 and the signal wiring SGL1 (SGL3) can be reduced by a synergetic effect between the state (1) without the planar overlapping between the reference wiring GL2 and the signal wiring SGL1 (SGL3) and the state (2) with the large shortest distance between the reference wiring GL2 and the signal wiring SGL1 (SGL3). Therefore, according to the first feature of the present first embodiment, such an appearing sub effect as the increase in the parasitic capacitance in the second related technique (see FIG. 9) can be suppressed.

In this case, as shown in, for example, FIG. 11B, the application of the first feature of the present first embodiment entails that the reference wiring GL2 is not arranged between the signal wiring SGL1 and the signal wiring SGL3. It apparently seems that the cross talk between the signal wiring SGL1 and the signal wiring SGL3 cannot be suppressed because the reference wiring GL2 functioning as a shield is not formed between the signal wiring SGL1 and the signal wiring SGL3. That is, it seems that the first feature of the present first embodiment is effective for reducing the parasitic capacitance between the reference wiring GL2 and the signal wiring SGL1 (SGL3) but not effective for reducing the cross talk between the signal wiring SGL1 and the signal wiring SGL3. Therefore, in the first feature of the present first embodiment, it seems that the cross talk between the signal wirings cannot be reduced while the increase in the parasitic capacitance is suppressed.

Regarding this point, by further application of the following second feature of the present first embodiment in addition to the application of the first feature of the present first embodiment, the cross talk between the signal wiring SGL1 and the signal wiring SGL3 can be reduced while the parasitic capacitance between the reference wiring GL2 and the signal wiring SGL1 (SGL3) is reduced. The second feature of the present first embodiment will be explained below.

As shown in, for example, FIG. 11B, the second feature of the present first embodiment shows that a plurality of reference wirings GL2 are arranged so as to sandwich a space therebetween and so that a width of this space is smaller than a wavelength of an electromagnetic wave that transmits through the signal wiring SGL1 and smaller than a wavelength of an electromagnetic wave that transmits through the signal wiring SGL3. In this manner, even if the plurality of reference wirings GL2 are arranged so as to sandwich the space therebetween, the cross talk generated between the signal wiring SGL1 and the signal wiring SGL3 can be reduced through the space. This is because the cross talk generated between the signal wiring SGL1 and the signal wiring SGL3 is generated by, for example, occurrence of a leakage electromagnetic wave (electromagnetic field) in periphery due to the electromagnetic wave transmitting through the signal wiring SGL1 and influence of this leakage electromagnetic wave on the electromagnetic wave transmitting through the signal wiring SGL3. That is, according to the second feature of the present first embodiment, the width of the space (the width in the x direction) between the adjacent reference wirings GL2 is smaller than the wavelength of the electromagnetic wave transmitting through the signal wiring SGL1. Consequently, even if there is the space between the adjacent reference wirings GL2, the leakage electromagnetic wave cannot pass through the space. Therefore, according to the second feature of the present first embodiment, the cross talk generated between the signal wiring SGL1 and the signal wiring SGL3 can be reduced.

For understandable explanation, for example, in a microwave oven, microwaves are generated inside a container so that moisture is heated by the microwaves, and a mesh-form sheet is pasted on a door of the container in order to avoid leakage of the microwaves out of the microwave oven. A size of a mesh formed in this mesh-form sheet is smaller than a wavelength of the microwave. As a result, the microwaves generated inside the container do not leak out of the microwave oven. On the other hand, visible light is shorter than the microwave in the wavelength, and therefore, the size of the mesh formed in this mesh-form sheet is set to be larger than a wavelength of the visible light, so that the visible light can pass through the mesh-form sheet. In this manner, in the microwave oven, when the mesh-form sheet having the mesh the size of which is smaller than the wavelength of the microwave and larger than the wavelength of the visible light is pasted on the door of the microwave oven, the inside of the container is visible from outside while the leakage of the microwaves is suppressed. Because of the same principle as such a principle of the mesh-form sheet in the microwave oven, according to the second feature of the present first embodiment, even if there is the space between the adjacent reference wirings GL2, the leaked electromagnetic waves cannot pass through this space. As a result, according to the second feature of the present first embodiment, the cross talk generated between the signal wiring SGL1 and the signal wiring SGL3 can be reduced.

By the application of the second feature of the present first embodiment in addition to the application of the first feature of the present first embodiment as described above, the cross talk between the signal wiring SGL1 and the signal wiring SGL3 can be reduced while the parasitic capacitance between the reference wiring GL2 and the signal wiring SGL1 (SGL3) is reduced.

Next, as shown in, for example, FIGS. 11a and 11B, a third feature of the present first embodiment shows that the plurality of reference wirings GL4 that are distant from each other are formed above the wiring layer L3. In this manner, the signal transmission property can be almost the same between the signal wirings SGL1 and SGL3 that are symmetrical to each other across the reference wiring GL2.

Specifically, for example, a case without the plurality of reference wirings GL4 above the wiring layer L3 will be considered. In this case, when attention is paid to the signal wirings SGL1 and SGL3 that are symmetrical to each other across the reference wiring GL2, the substrate SUB having a conductivity that is intermediate between those of a conductor and an insulating body is arranged in a lower layer of the signal wiring SGL1. On the other hand, a member having the conductivity that is intermediate between those of the conductor and the insulating body is not arranged above the signal wiring SGL3. Therefore, when the plurality of reference wirings GL4 are not arranged above the signal wiring SGL3, the signal transmission property of the signal wiring SGL1 and the signal transmission property of the signal wiring SGL3 are slightly different from each other. Consequently, when the signal transmission property of the signal wiring SGL1 and the signal transmission property of the signal wiring SGL3 are compared with each other, the "skew" that is the positional shift of the intersections (center points) of the rising and the falling of the signal transmission waveforms occurs.

On the other hand, in application of such a third feature of the present first embodiment as forming the plurality of reference wirings GL4 that are distant from each other above the wiring layer L3, the plurality of reference wirings GL4 are arranged on the third interlayer insulating layer included in the wiring layer L3. This means that the insulating body (the third interlayer insulating layer) and the conductor (the reference wiring GL4) are alternately arranged above the wiring layer L3. It seems as if this result is equivalent on average to a state in which the member having the conductivity that is intermediate between those of the conductor and the insulating body is arranged above the wiring layer L3. Therefore, according to the third feature of the present first embodiment, while the substrate SUB having the conductivity that is intermediate between those of the conductor and the insulating body is arranged in the lower layer of the signal wiring SGL1, it seems as if the member having the conductivity that is intermediate between those of the conductor and the insulating body is arranged above the signal wiring SGL3. Therefore, the signal transmission property of the signal wiring SGL1 and the signal transmission property of the signal wiring SGL3 are almost the same as each other. That is, according to the third feature of the present first embodiment, when the signal transmission waveform of the signal wiring SGL1 and the signal transmission waveform of the signal wiring SGL3 are compared with each other, the intersections (center points) of the rising and the falling of the signal transmission waveforms almost match each other so that the occurrence of the "skew" can be suppressed.

<Verification of Effect of First Embodiment>

FIGS. 12A to 12D are diagrams each showing a calculation result of a signal transmission waveform at the time of simultaneous operation in the interposer SI of the present first embodiment. Particularly, FIG. 12A is a diagram showing a signal transmission waveform of a signal applied to the signal wiring AG2, and FIG. 12B is a diagram showing a signal transmission waveform of a signal applied to the signal wiring AG3. Meanwhile, FIG. 12C is a diagram showing a signal transmission waveform of a signal applied to the signal wiring AG1, and FIG. 12D is a diagram showing a signal transmission waveform of a signal applied to the signal wiring VT. As shown in FIG. 12A to 12D, it is found that the signal transmission waveform of the signal applied to the signal wiring VT in the interposer SI of the present first embodiment is significantly improved. This improvement is a result confirming that the cross talk is suppressed by the second feature of the present first embodiment. It is also found that the signal transmission waveforms of the signals applied to the signal wiring AG1 to AG3 are improved. This improvement is a result confirming that the increase in the parasitic capacitance is suppressed by the first feature of the present first embodiment.

Further, when attention is paid to the signal wirings AG2 and AG3 that are symmetrical to each other across the reference wiring GL2 formed in the wiring layer L2 in FIG. 11, as shown in FIGS. 12A and 12B, it is found that the positions of the intersections (center points) of the rising and the falling of the signal transmission waveforms almost match each other so that the occurrence of the "skew" is suppressed. This suppression is a result confirming that the symmetry in the conductivity between the signal wirings AG2 and AG3 that are opposite to each other through the reference wiring GL2 formed in the wiring layer L2 is improved by the third feature of the present first embodiment. In this manner, according to the third feature of the present first embodiment, the upper and lower signal transmission properties across the reference wiring GL2 are symmetrical to each other, and the occurrence of the "skew" is consequently suppressed. As a result, according to the interposer SI of the present first embodiment, the signal of the same channel can be transmitted to the upper and lower signal wirings across the reference wiring GL2.

In the above-described manner, when the interposer SI of the present first embodiment has the above-described first, second and third features, the cross talk among the signal wirings can be reduced while the increase in the parasitic capacitance and the occurrence of the "skew" are suppressed.

The above descriptions are summarized as follows. For example, as shown in FIG. 11B, the interposer SI of the present first embodiment has the wiring layers L1 to L3 including the copper wiring, and the reference wiring GL4 made of the aluminum wiring formed on the wiring layer L3. Specifically, as shown in FIGS. 11A and 11B, in the interposer SI of the present first embodiment, a stripe-form reference wirings GL2 extending in the y direction are formed in the wiring layer L2. Meanwhile, in the interposer SI of the present first embodiment, the signal wiring SGL1 is included in the wiring layer L1, and the signal wiring SGL3 is included in the wiring layer L3. In this case, to the reference wiring GL2, for example, a ground potential is supplied. However, the potential is not limited to this, and a power supply potential may be supplied to the reference wiring GL2. That is, generally, a DC potential is supplied to the reference wiring GL2. Since the DC potential is supplied to the reference wiring GL2 as described above, a reference potential of a signal is supplied to the reference wiring GL2 in terms of AC (RF).

In this case, the reference wiring GL2 arranged in the wiring layer L2 is arranged so as to be distant from the signal wiring SGL1 arranged in the wiring layer L1 in a plan view, and so as to be distant from the signal wiring SGL3 arranged in the wiring layer L3 in a plan view. Further, in the interposer SI of the present first embodiment, the stripe-form reference wirings GL4 are arranged above the wiring layer L3. This reference wiring GL4 is arranged so as to be distant from the signal wiring SGL3 arranged in the wiring layer L3 in a plan view. Also to the reference wiring GL4, a DC potential represented by the ground potential and the power supply potential is supplied as similar to the reference wiring GL2. In this case, the plurality of reference wirings GL4 that are arranged in the stripe form meet such a limitation that occupation of the reference wirings GL4 is about 50%.

In the interposer SI of the present first embodiment configured as described above, the signal wiring SGL1 (SGL3) and the reference wiring GL2 are bonded to each other at their edges, and therefore, an opposing area between the reference wiring GL2 and the signal wiring SGL1 (SGL3) is effectively small. As a result, in the interposer SI of the present first embodiment, a parasitic capacitance (wiring load capacitance) between the reference wiring GL2 and the signal wiring SGL1 (SGL3) is reduced (as the first feature).

Next, in the interposer SI of the present first embodiment, a slit width of the reference wiring GL2 (a width of the space in the x direction between the adjacent reference wirings GL2) is, for example, about 3 µm due to limitation of a semiconductor manufacturing process. This is because the semiconductor manufacturing process does not allow both increase in the occupation of the reference wirings GL2 in a wide region and increase in non-occupation in a wide region. In this case, when a signal frequency is obtained in a case in which a relative permittivity of an interlayer insulating layer is 4 and in which the slit width is 1/20 times a wavelength of a transmitted electromagnetic wave, the signal frequency is 2.5 THz. This value exceeds a frequency of an electromagnetic wave at which a signal can be transmitted through the signal wiring SGL1 (SGL3) made of the metallic wiring. Therefore, since the slit width is about 1/20 times the wavelength in the interposer SI of the present first embodiment, the practical electromagnetic wave leaked from the signal wiring SGL1 (SGL3) cannot pass through the slit. Therefore, in the interposer SI of the present first embodiment, in spite of existence of the slit between the adjacent reference wirings GL2, a signal (electromagnetic wave) transmitting through the signal wiring SGL3 arranged above the slit and a signal (electromagnetic wave) transmitting through the signal wiring SGL1 arranged below the slit are substantially electrically separated from each other, and therefore, the cross talk is extremely small (as the second feature).

In the interposer SI of the present first embodiment, for example, as shown in FIG. 11B, note that the reference wiring to which the reference potential is supplied is not formed between the adjacent signal wirings SGL1. However, in the interposer SI of the present first embodiment, each of a distance (vertical distance) between the signal wiring SGL1 and the reference wiring GL2 and a distance (vertical distance) between the reference wiring GL2 and the signal wiring SGL3 is only about 0.5 µm. Therefore, by reduction in the vertical distances (distances in a vertical direction), spreading of the electromagnetic waves in a horizontal direction is suppressed. As a result, in the interposer SI of the present first embodiment, the cross talk in the same wiring layer (the wiring layer L1 and the wiring layer L3) caused by the spreading of the electromagnetic waves in the lateral direction is small.

Further, in the interposer SI of the present first embodiment, for example, as shown in FIG. 11B, the substrate SUB having the conductivity that is intermediate between those of the conductor and the insulating body is formed below the wiring layer L1. Meanwhile, in the interposer SI of the present first embodiment, the plurality of reference wirings GL4 each made of the metallic wiring are arranged above the wiring layer L3 through the space. Therefore, the insulating bodies (the third interlayer insulating layers) and the conductors (the reference wirings GL4) are alternately arranged above the wiring layer L3, and this arrangement is equivalent on average to a state in which a semiconductor having the conductivity that is intermediate between those of the insulating body and the conductor is arranged above the wiring layer L3. As a result, the signal transmission property of the signal transmitting through the signal wiring SGL1 arranged in the wiring layer L1 and the signal transmission property of the signal transmitting through the signal wiring SGL3 arranged in the wiring layer L3 are almost the same as each other (as the third feature).

In the above-described manner, when the interposer SI of the present first embodiment has the above-described first, second and third features, the cross talk among the signal wirings can be reduced while the increase in the parasitic capacitance (wiring load capacitance) and the occurrence of the "skew" are suppressed.

Figure 13:
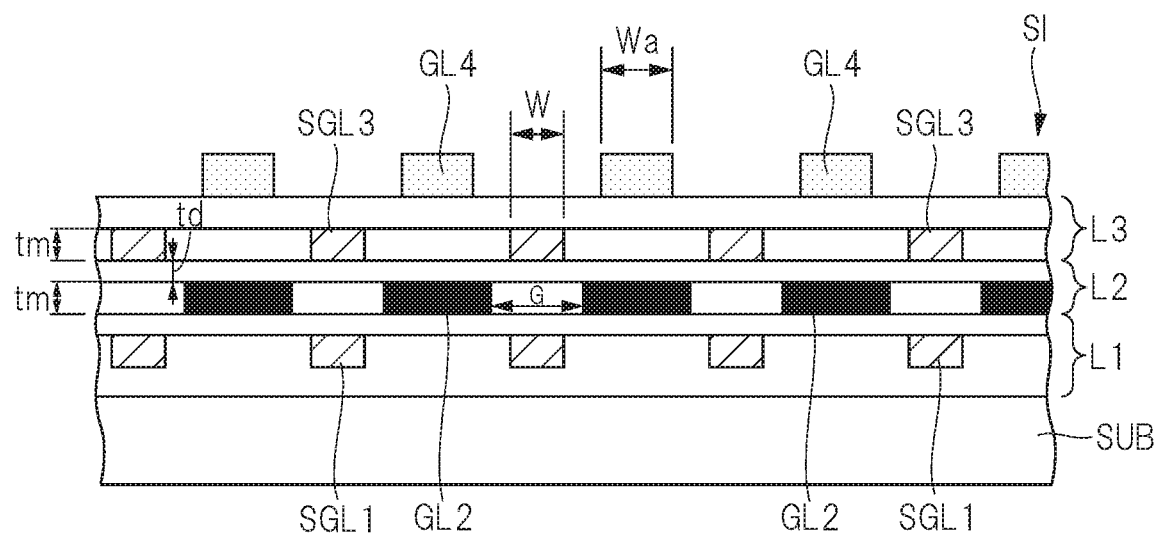
FIG. 13 is a diagram showing an optimal design example of the interposer according to the first embodiment.

FIG. 13 is a diagram showing an optimal design example of the interposer SI of the present first embodiment. In FIG. 13, it is assumed that a width of the signal wiring SGL3 (SGL1) is "W", assumed that a distance between the spaces (slit widths) between the adjacent reference wirings GL2 is "G", and assumed that a width of the reference wiring GL4 is "Wa". In this case, for example, as shown in FIG. 13, the design can be made so as to satisfy a relation "W:G:Wa=1: 1.6:1.5". And, in FIG. 13, when it is assumed that a thickness of the signal wiring SGL3 (SGL1) is "tm", assumed that a thickness of the reference wiring GL2 is "tm", and assumed that the vertical distance between the reference wiring GL2 and the signal wiring SGL3 is "td", the design can be made so as to satisfy a relation "tm:td=2:1".

First Modification Example

Figure 14A:
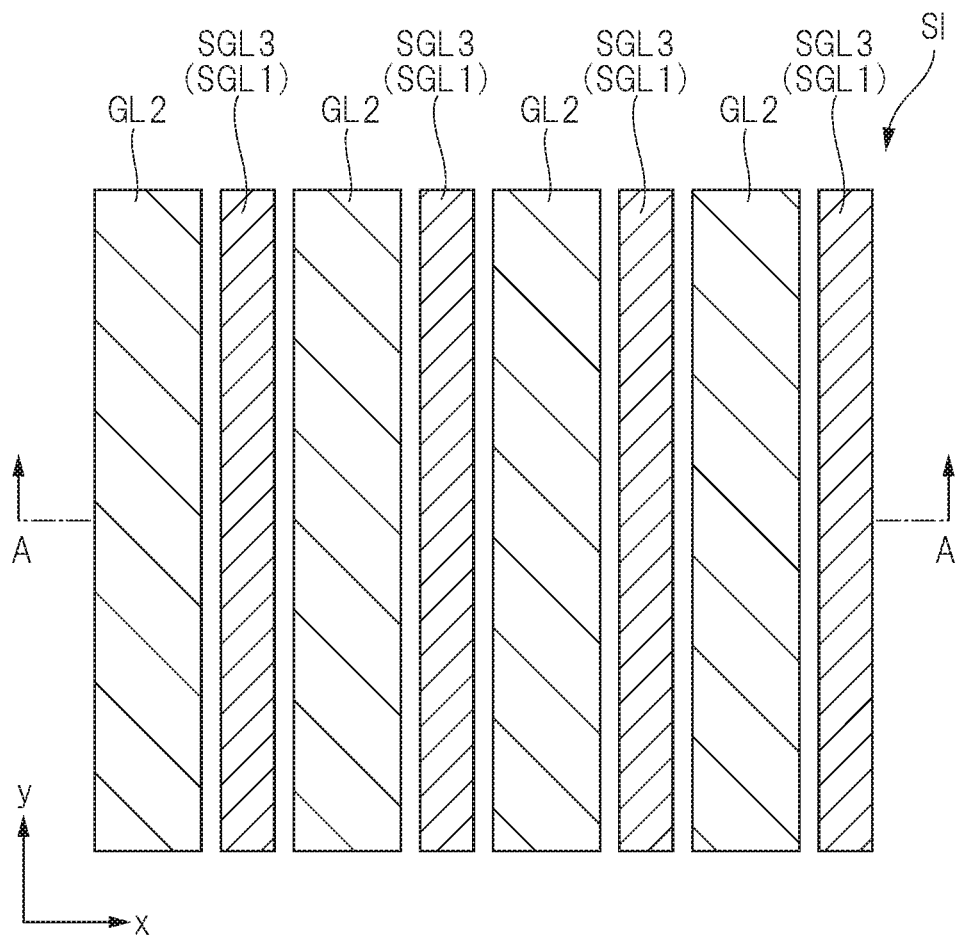
FIGS. 14A and 14B are diagrams each showing a schematic configuration of an interposer according to a first modification example of the first embodiment.
Figure 14B:
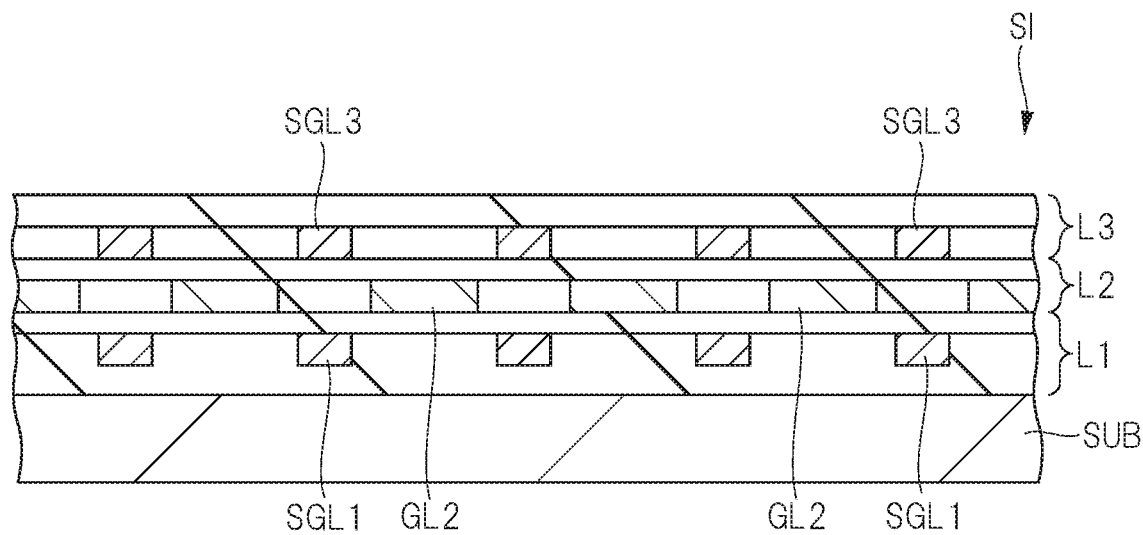

FIGS. 14A and 14B are diagrams each showing a schematic configuration of an interposer SI of a first modification example of the first embodiment. Particularly, FIG. 14A is a diagram showing a schematic plan layout of the interposer SI of the present first modification example, and FIG. 14B is a cross-sectional view obtained by cutting a line A-A of FIG. 14A. First, as shown in FIG. 14A, individual reference wirings GL2 extend in the y direction, and the plurality of reference wirings GL2 are arranged side by side through a space with a predetermined distance (slit width) in the x direction. As shown in FIG. 14A, in a plan view, the signal wiring SGL3 (SGL1) is arranged in the space between the adjacent reference wirings GL2. This signal wiring SGL3 (SGL1) is configured so as to extend in the y direction.

In FIG. 14B, for example, the wiring layer L1 is formed on the substrate SUB made of a semiconductor material represented by silicon. The wiring layer L2 is formed on the wiring layer L1, and the wiring layer L3 is formed on the wiring layer L2. The plurality of signal wirings SGL1 are arranged in the wiring layer L1, and the plurality of reference wirings GL2 are arranged in the wiring layer L2. The plurality of signal wirings SGL3 are arranged in the wiring layer L3.

In the present first modification example, for example, as shown in FIG. 14B, the reference wiring GL4 is not formed above the wiring layer L3. In the above-described first embodiment, the stripe-form reference wirings GL4 formed above the wiring layer L3 have a function of suppressing the occurrence of the "skew" by equalizing the signal transmission property of the signal transmitting through the signal wiring SGL1 arranged in the wiring layer L1 to the signal transmission property of the signal transmitting through the signal wiring SGL3 arranged in the wiring layer L3. In this case, when the signal wirings to be used for each group (channel) in which timing constraints should be maintained are limited to the signal wirings formed in the same wiring layer, there is no problem even if the "skew" occurs to some extent. Therefore, for example, when the signal wirings formed in the same wiring layer are used for the transmissions of the signals belonging to the same channel, there is no problem even if the configuration without the reference wiring GL4 above the wiring layer L3 as shown in the present first modification example is applied. However, the interposer SI of the present first modification example still has the above-described first and second features explained in the above-described first embodiment. Therefore, as similar to the first embodiment, the cross talk among the signal wirings can be reduced while the increase in the parasitic capacitance (the wiring load capacitance) is suppressed.

Since the reference wiring GL4 is not formed above the wiring layer L3 in the present first modification example, the following advantages can be obtained. That is, when the reference wiring GL4 is formed above the wiring layer L3, such a part of the reference wiring GL2 as overlapping the reference wiring GL4 in a plan view is covered, and therefore, it is difficult to observe the reference wiring GL2 formed in the wiring layer L2. On the other hand, in the configuration of the present first modification example in which the reference wiring GL4 is not formed above the wiring layer L3, failure in the formation of the reference wiring GL2 in the wiring layer L2 can be easily observed. Therefore, according to the interposer SI of the present first modification example, it is easy to analyze the failure in the formation of the reference wiring GL2, so that a quality of the interposer SI can be improved.

Second Modification Example

Figure 15:
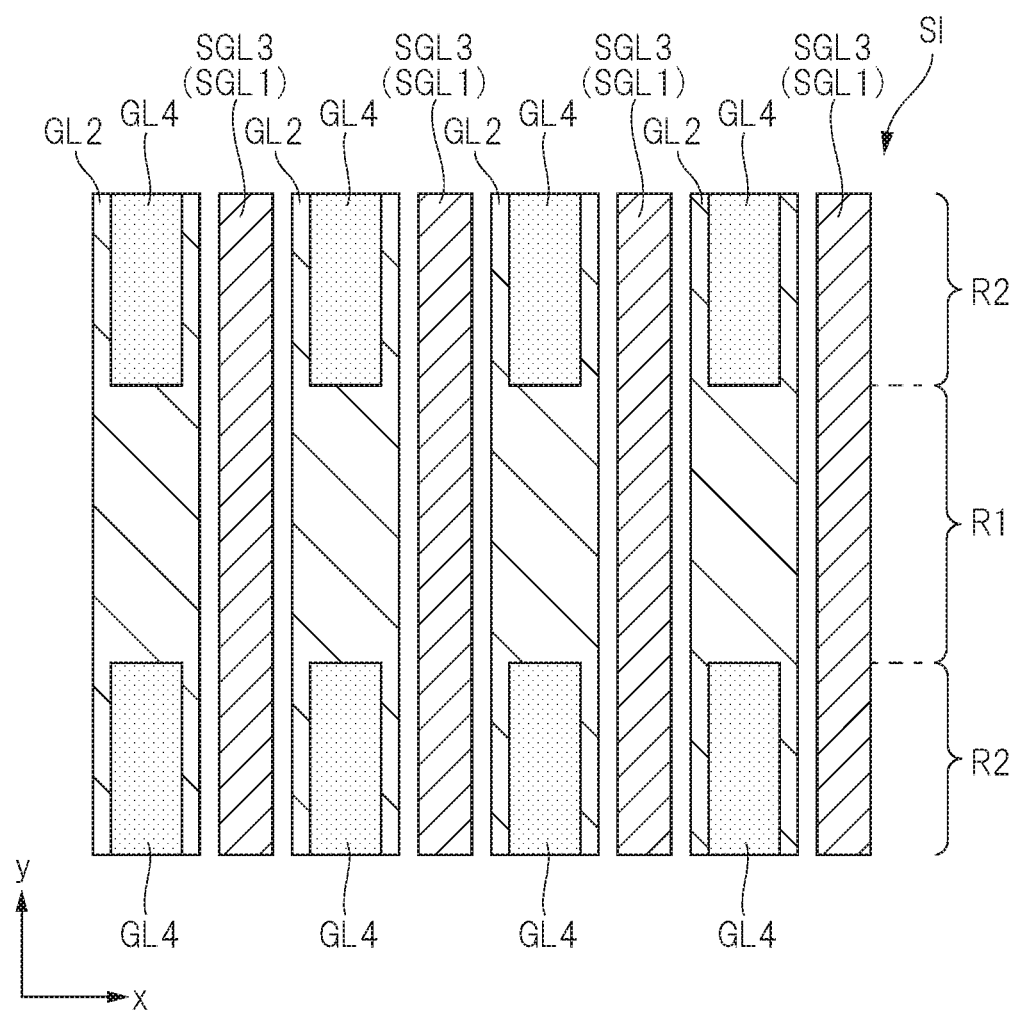
FIG. 15 is a plan view showing a schematic plan layout of an interposer according to a second modification example.

Subsequently, an interposer SI of a second modification example of the first embodiment will be explained. FIG. 15 is a plan view showing a schematic plan layout of the interposer SI of the present second modification example. In FIG. 15, the interposer SI of the present second modification example has a region R1 and a region R2 in a plan view. In this case, as shown in FIG. 15, while the plurality of reference wirings GL4 included in the plurality of reference wirings GL2 are not formed in the region R1 in a plan view, the plurality of reference wirings GL4 included in the plurality of reference wirings GL2 are formed in the region R2 in a plan view. As described above, the plurality of reference wirings GL4 can be formed in only a part (the region R2) of regions in a plan view.

Third Modification Example

Figure 16:
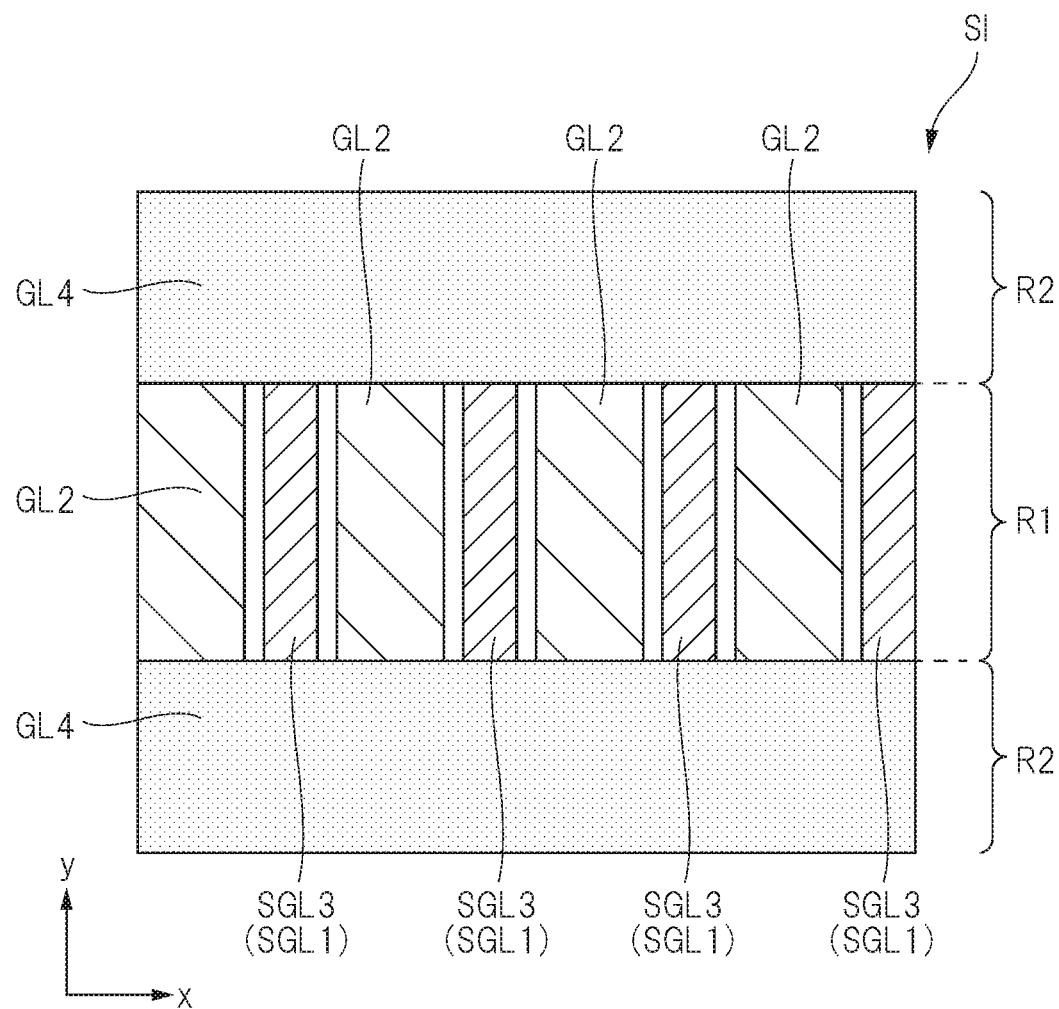
FIG. 16 is a plan view showing a schematic plan layout of an interposer according to a third modification example.

Next, an interposer SI of a third modification example of the first embodiment will be explained. FIG. 16 is a plan view showing a schematic plan layout of the interposer SI of the present third modification example. In FIG. 16, the interposer SI of the present third modification example has a region R1 and a region R2 in a plan view. In this case, as shown in FIG. 16, while the plurality of reference wirings GL4 included in the plurality of reference wirings GL2 are not formed in the region R1 in a plan view, the reference wiring GL4 made of a plane pattern (wide pattern) is formed in the region R2 in a plan view. As described here, the reference wiring GL4 made of the plane pattern can be formed in only a part (the region R2) of regions in a plan view. This is because an upper layer of the wiring layer L3 to be the top layer has no limitation in the pattern occupation as different from the inner wiring layers, and therefore, the plane form of the reference wiring GL4 is possible. In this case, when the reference wiring GL4 is made of the plane pattern, stability of the reference potential supplied to the reference wiring GL4 can be improved. However, when the reference wiring GL4 made of the plane pattern is formed over the entire top layer on the upper side of the wiring layer L3, the parasitic capacitance (the wiring load capacitance) undesirably increases. Therefore, as explained in the present third modification example, the reference wiring GL4 made of the plane pattern is formed in only a part (the region R2) of regions. That is, a plurality of plane patterns functioning as the reference wiring GL4 are formed in the top layer on the upper side of the wiring layer L3, and the plurality of plane patterns are arranged so as to be distant from one another in a plan view.

In this manner, by the reference wiring GL4 made of the plane pattern formed in a part of regions, while the parasitic capacitance is slightly increased, the cross talk among the signal wirings is further reduced. That is, although it is desirable to form the reference wiring GL4 made of the plane pattern over the entire top layer on the upper side of the wiring layer L3 from the viewpoint of the attempt to further reduce the cross talk among the signal wirings, the parasitic capacitance is undesirably significantly increased by the formation of the reference wiring GL4 made of the plane pattern over the entire top layer on the upper side of the wiring layer L3. Accordingly, in the present third modification example, from the viewpoint of the attempt to reduce the cross talk among the signal wirings while the increase in the parasitic capacitance (the wiring load capacitance) is suppressed, the reference wiring GL4 made of the plane pattern is formed in only a part (the region R2) of regions. As such a configuration in which the cross talk among the signal wirings is reduced while the increase in the parasitic capacitance (the wiring load capacitance) is suppressed, the configuration of the interposer SI of the present third modification example is also applicable.

Second Embodiment

Figure 17:
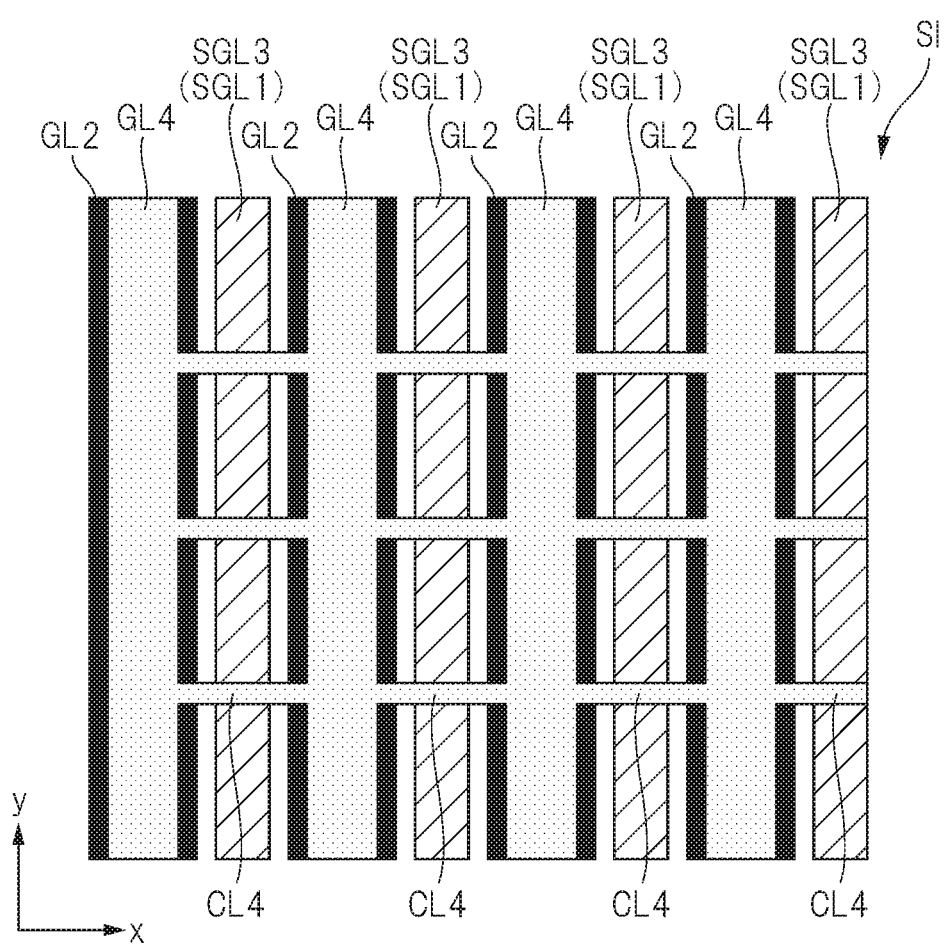
FIG. 17 is a plan view showing a schematic plan layout of an interposer according to a second embodiment.

FIG. 17 is a plan view showing a schematic plan layout of an interposer SI of the present second embodiment. As shown in FIG. 17, in the interposer SI of the present second embodiment, the plurality of reference wirings GL4 are connected by a plurality of connection wirings CL4. In this manner, in the interposer SI of the present second embodiment, by mutually connecting the plurality of reference wirings GL4 arranged in the stripe form by using the plurality of connection wirings CL4, the reference potentials supplied to the reference wirings GL4 are equalized to one another to stabilize the signal transmission property. Particularly, the configuration of the interposer SI of the present second embodiment is effectively applied to a configuration having a large length of a wiring formed in the interposer SI, a configuration having a large width of an input/output region (I/O region) inside a semiconductor component connected to the interposer SI, and others.

In the interposer SI of the present second embodiment, for example, as shown in FIG. 17, the connection wirings CL4 and the signal wirings SGL1 (SGL3) cross each other in a plan view. Therefore, although the parasitic capacitance (the wiring load capacitance) slightly increases, the cross talk among the signal wirings can be reduced while the significant increase in the parasitic capacitance (the wiring load capacitance) is suppressed as similar to the above-described first embodiment.

Figure 18:
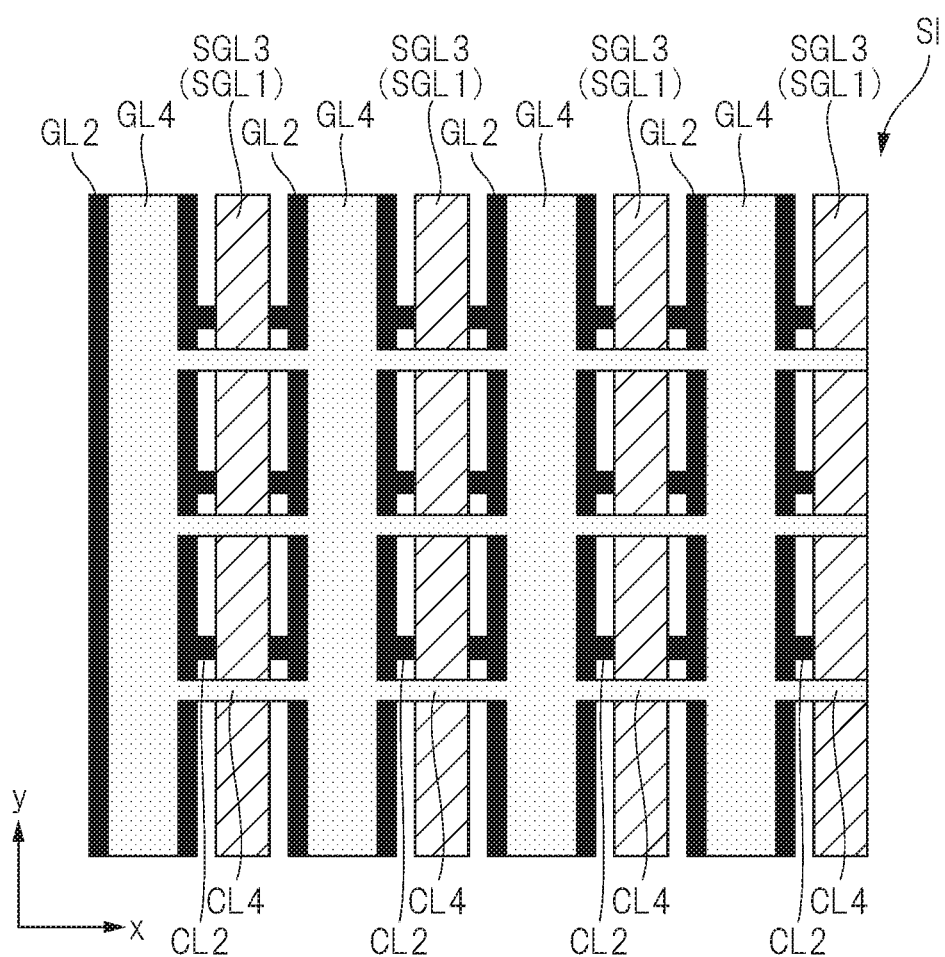
FIG. 18 is a plan view showing one example of a schematic plan layout of an interposer.
Figure 19:
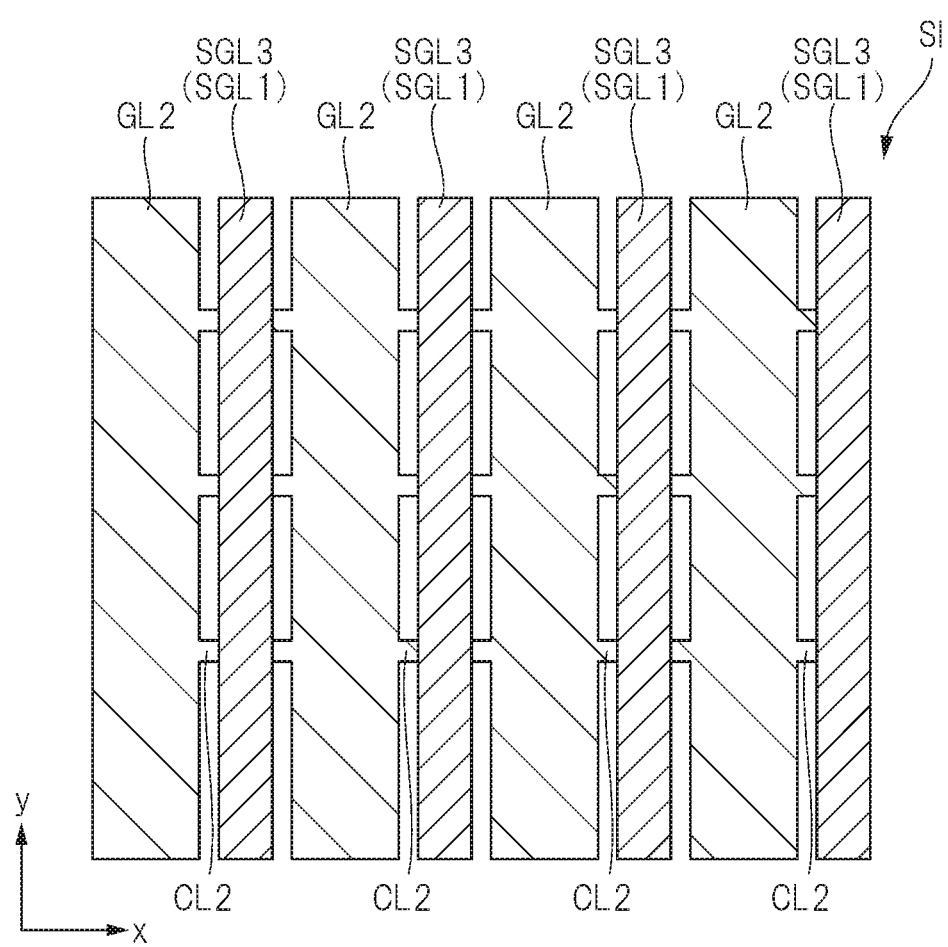
FIG. 19 is a plan view showing one example of a schematic plan layout of an interposer.
Figure 20:
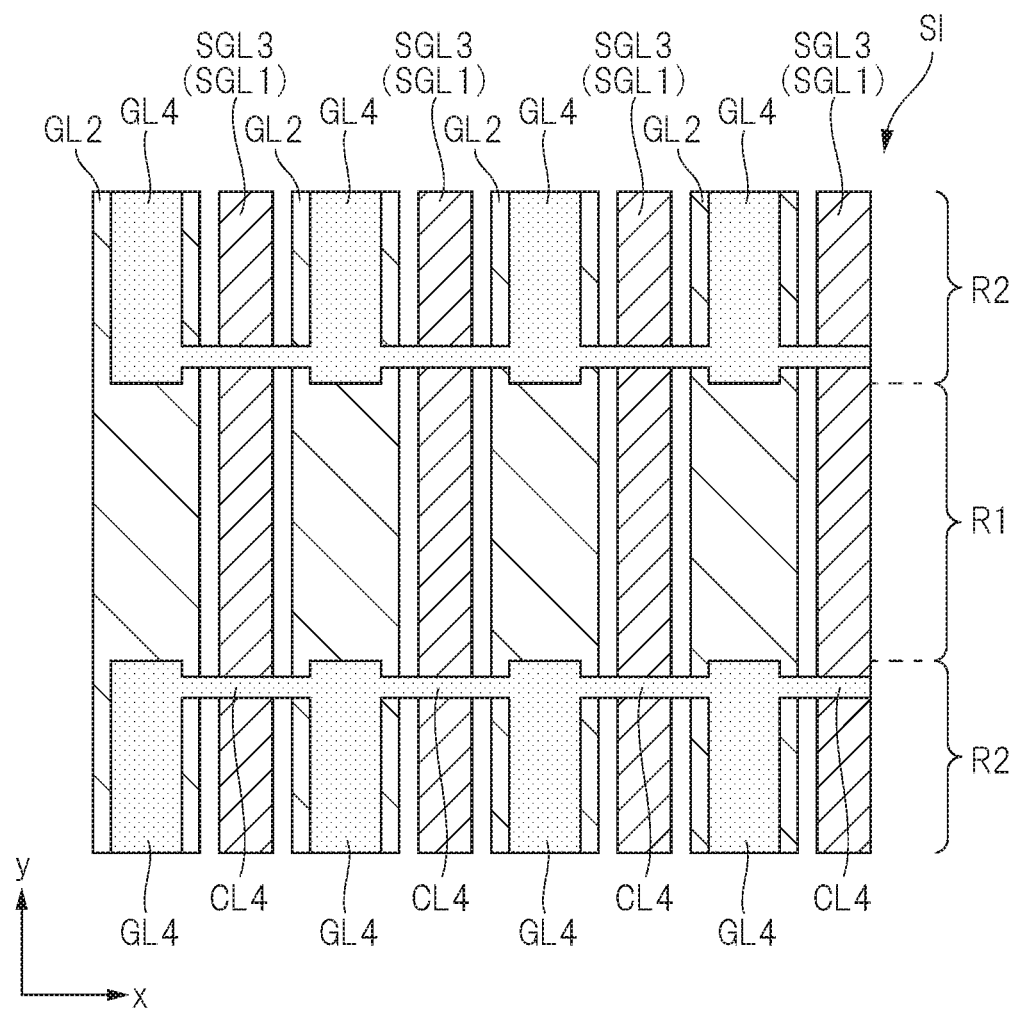
FIG. 20 is a plan view showing one example of a schematic plan layout of an interposer.

For example, as shown in FIG. 18, note that not only the connection of the plurality of reference wirings GL4 by using the plurality of connection wirings CL4 but also connection of the plurality of reference wirings GL2 by using a plurality of connection wirings CL2 are applicable. And, as shown in FIG. 19, while the reference wiring GL4 is not formed, the connection of the plurality of reference wirings GL2 by using the plurality of connection wirings CL2 is applicable. Further, as shown in FIG. 20, the reference wiring GL4 is not formed in the region R1 but formed in only the region R2, and the plurality of reference wirings GL4 formed in the region R2 can be connected by using the connection wiring CL4.

<Layout Limitation of Connection Wiring>

When the plurality of stripe-form reference wirings are connected to one another by using the plurality of connection wirings, the connection wirings and the signal wirings cross each other in a plan view, and therefore, the parasitic capacitance (the wiring load capacitance) increases. Therefore, in order to reduce the parasitic capacitance, it is desirable to reduce an overlapping degree between the connection wirings and the signal wirings in a plan view. In this case, for example, in FIG. 11, a thickness of the third interlayer insulating layer included in the wiring layer L3 is larger than a thickness of the second interlayer insulating layer included in the wiring layer L2. Therefore, when attention is paid to, for example, the signal wiring SGL3 arranged in the wiring layer L3 in FIG. 18, a parasitic capacitance caused by the planar overlapping between the signal wiring SGL3 and the connection wiring CL2 connecting the plurality of reference wirings GL2 to one another is larger than a parasitic capacitance caused by the planar overlapping between the signal wiring SGL3 and the connection wiring CL4 connecting the plurality of reference wirings GL4 to one another. This is because a distance between the connection wiring CL2 and the signal wiring SGL3 is smaller than a distance between the connection wiring CL4 and the signal wiring SGL3 since the thickness of the third interlayer insulating layer included in the wiring layer L3 is larger than the thickness of the second interlayer insulating layer included in the wiring layer L2 in FIG. 11 as described above. That is, the smaller the distance between the connection wiring and the signal wiring that are oppose to each other is, the larger the parasitic capacitance is. Therefore, the parasitic capacitance caused by the planar overlapping between the signal wiring SGL3 and the connection wiring CL2 is larger than the parasitic capacitance caused by the planar overlapping between the signal wiring SGL3 and the connection wiring CL4. Specifically, for example, "the parasitic capacitance caused by the planar overlapping between the signal wiring SGL3 and the connection wiring CL2":"the parasitic capacitance caused by the planar overlapping between the signal wiring SGL3 and the connection wiring CL4" is 5:1. Therefore, while the connection wiring CL4 only slightly affects the parasitic capacitance (the wiring load capacitance), the connection wiring CL2 largely affects the parasitic capacitance (the wiring load capacitance). Therefore, particularly in order to reduce the parasitic capacitance, it is desirable to limit the pattern occupation of the plurality of connection wirings CL2 mutually connecting the plurality of reference wirings GL2 arranged in the wiring layer L2.

Figure 21:
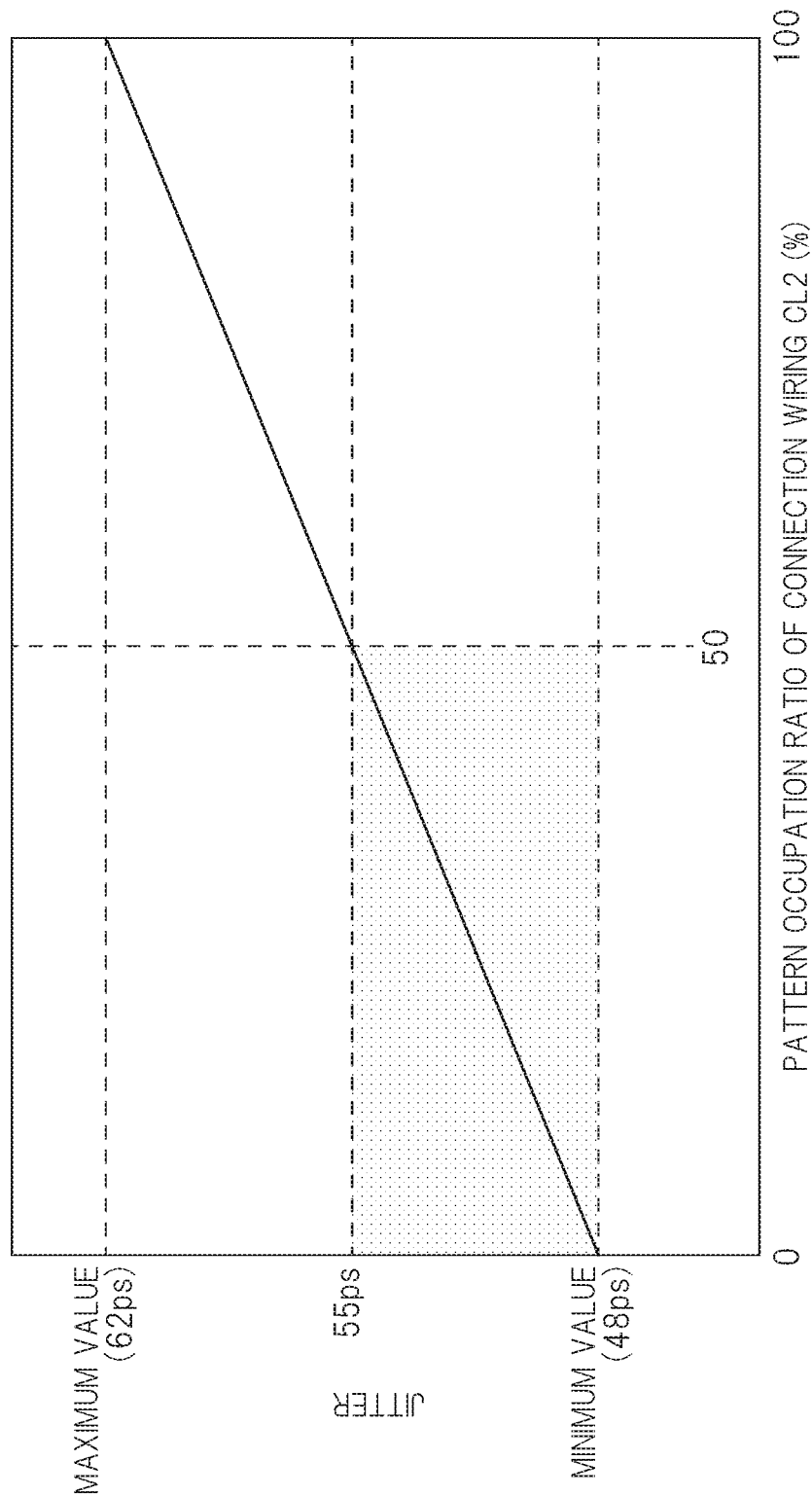
FIG. 21 is a graph showing a relation between a pattern occupation of a connection wiring and a jitter on the basis of a parasitic capacitance.

FIG. 21 is a graph showing a relation between a pattern occupation of the connection wiring CL2 and a jitter on the basis of the parasitic capacitance. As shown in FIG. 21, the jitter on the basis of the parasitic capacitance almost linearly changes with respect to the pattern occupation of the connection wiring CL2. Specifically, when the pattern occupation of the connection wiring CL2 is 0%, the jitter on the basis of the parasitic capacitance has the minimum value. On the other hand, when the pattern occupation of the connection wiring CL2 is 100%, the jitter on the basis of the parasitic capacitance has the maximum value. And, the large parasitic capacitance means dull signal-waveform rising/falling, and the dull signal-waveform rising/falling means a large jitter (timing shift). Therefore, in order to obtain a small jitter, it is required to reduce the parasitic capacitance. For example, if a parasitic-capacitance reduction effect of about 50% cannot be obtained, the signal waveform cannot be tangibly improved. For example, in the example of FIG. 21, when the pattern occupation of the connection wiring CL2 is 100%, the jitter is 62 ps. On the other hand, when the pattern occupation is 50%, the jitter is improved up to 55 ps. Therefore, the pattern occupation of the connection wiring CL2 is desirably larger than 0% and equal to or smaller than 50%.

In another expression, the plurality of reference wirings GL2 are arranged through the space in a plan view, and the plurality of reference wirings GL2 are connected to one another by the plurality of connection wirings CL2. The plurality of connection wirings CL2 are arranged in the above-described space. In this case, a ratio of an occupation area of the plurality of connection wirings CL2 with respect to an entire area of the space is larger than 0% and equal to or smaller than 50%. In this manner, the parasitic-capacitance reduction effect of about 50% or higher can be obtained, so that the tangible signal-waveform improvement represented by the suppression in the jitter can be obtained.

Third Embodiment

Figure 22A:
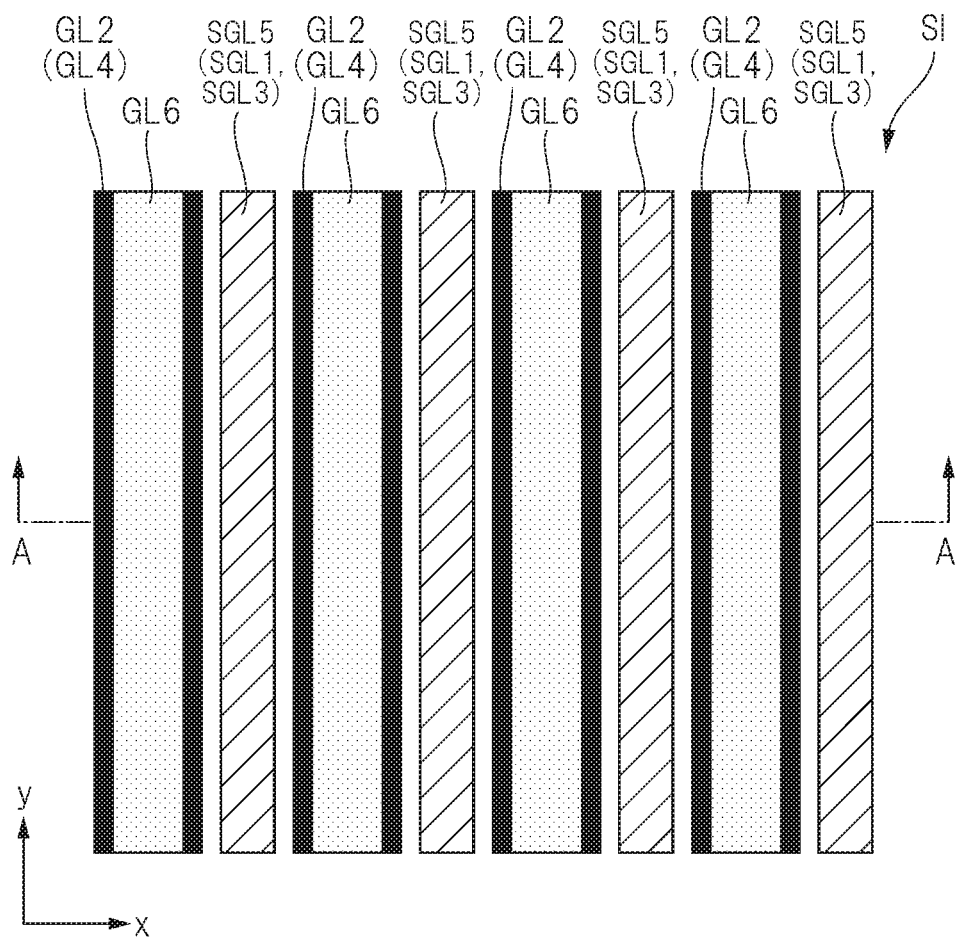
FIGS. 22A and 22B are a plan view showing a schematic plan layout of an interposer according to a third embodiment and a cross-sectional view obtained by cutting a line A-A of FIG. 22A, respectively.
Figure 22B:
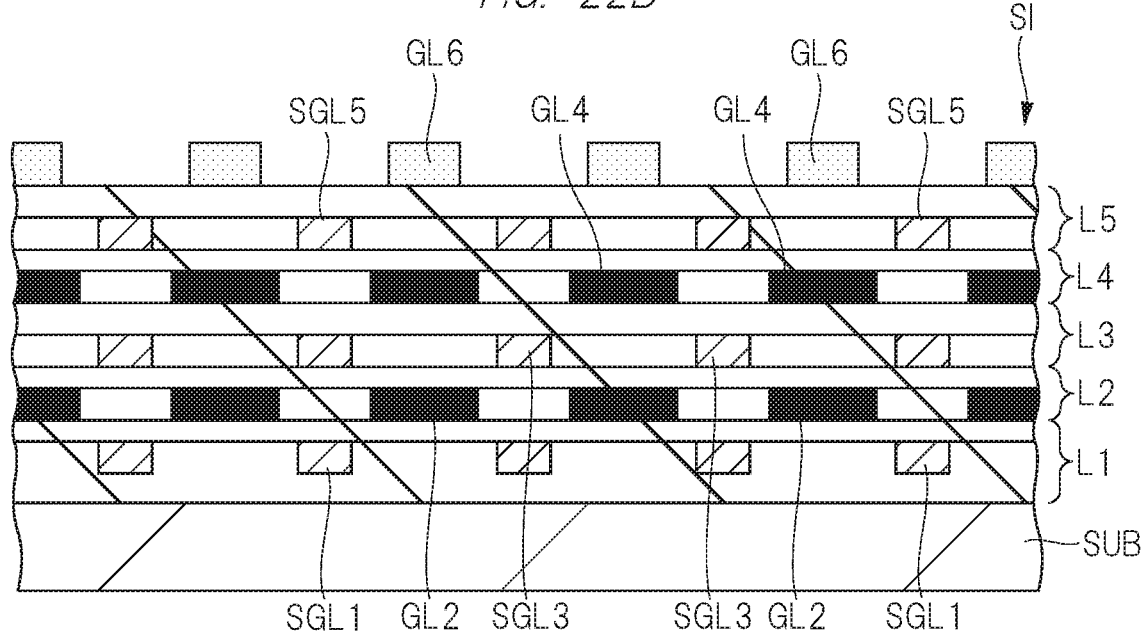

FIGS. 22A and 22B are diagrams each showing a schematic configuration of an interposer SI of the present third embodiment. Particularly, FIG. 22A is a plan view showing a schematic plan layout of the interposer SI of the present third embodiment, and FIG. 22B is a cross-sectional view obtained by cutting a line A-A of FIG. 22A. First, as shown in FIG. 22A, the signal wiring SGL1, the signal wiring SGL3 and the signal wiring SGL5 extend in the y direction while overlapping one another in a plan view. The signal wirings SGL5 (SGL3, SGL1) extending in the y direction are arranged side by side in the x direction so as to have a predetermined distance therebetween. Further, the reference wiring GL2 extending in the y direction is arranged so as to be sandwiched between the signal wirings SGL5 (SGL3, SGL1), and the reference wiring GL4 extending in the y direction is arranged so as to overlap this reference wiring GL2 in a plan view. Still further, a reference wiring GL6 extending in the y direction is arranged so as to overlap this reference wiring GL4 in a plan view. In this case, the reference wiring GL2 (GL4, GL6) and the signal wiring SGL5 (SGL3, SGL1) are arranged so as not to overlap each other in a plan view.

Next, in FIG. 22B, the interposer SI has, for example, the substrate SUB made of silicon, and the wiring layer L1 is formed on this substrate SUB. The wiring layer L2 is formed on the wiring layer L1, and the wiring layer L3 is formed on the wiring layer L2. In addition, the wiring layer L4 is formed on the wiring layer L3, and the wiring layer L5 is formed on the wiring layer L4. The plurality of signal wirings SGL1 are formed in the wiring layer L1. Subsequently, the plurality of reference wirings GL2 are formed in the wiring layer L2. Each of the plurality of reference wirings GL2 is arranged so as not to overlap the signal wiring SGL1 in a plan view. Next, the plurality of signal wirings SGL3 are formed in the wiring layer L3. Each of the plurality of signal wirings SGL3 is arranged so as not to overlap the reference wiring GL2 in a plan view but so as to overlap the signal wiring SGL1 in a plan view. And, the plurality of reference wirings GL4 are formed in the wiring layer L4. Each of the plurality of reference wirings GL4 is arranged so as to overlap the reference wiring GL2 in a plan view but so as not to overlap the signal wiring SGL1 (SGL3) in a plan view. Subsequently, the plurality of signal wirings SGL5 are formed in the wiring layer L5. Each of the plurality of signal wirings SGL5 is arranged so as not to overlap the reference wiring GL2 (GL4) in a plan view but so as to overlap the signal wiring SGL1 (SGL3) in a plan view. The plurality of reference wirings GL6 are formed on the wiring layer L5. Each of the plurality of reference wirings GL6 is arranged so as not to overlap the signal wiring SGL1 (SGL3, SGL5) in a plan view but so as to overlap the reference wiring GL2 (GL4) in a plan view.

The present third embodiment can be also configured so that the reference wiring GL6 is not formed above the wiring layer L5. In this case, the signal transmission property of the signal transmitting through the signal wiring SGL3 and the signal transmission property of the signal transmitting through the signal wiring SGL5 are symmetrical to each other. On the other hand, the signal transmission property of the signal transmitting through the signal wiring SGL1 is different from the signal transmission property of the signal transmitting through the signal wiring SGL3 and the signal transmission property of the signal transmitting through the signal wiring SGL5 because of the influence of the substrate SUB made of the semiconductor material. Therefore, when the reference wiring GL6 is configured so as not to be formed above the wiring layer L5, the signals belonging to the same channel may be transmitted through the signal wiring SGL3 arranged in the wiring layer L3 and the signal wiring SGL5 arranged in the wiring layer L5. On the other hand, the signal wiring SGL1 arranged in the wiring layer L1 is not symmetrical to other signal wiring SGL3 (SGL5), and therefore, it is required to transmit all the signals belonging to the same channel through only the signal wiring SGL1.

Modification Example

In the interposer SI that transmits high-speed signals such as a data signal and a clock signal and a relatively-slow-speed control signal, it is not required to apply the configuration having the first and second features of the above-described first embodiment to all the signal wirings.

Figure 23:
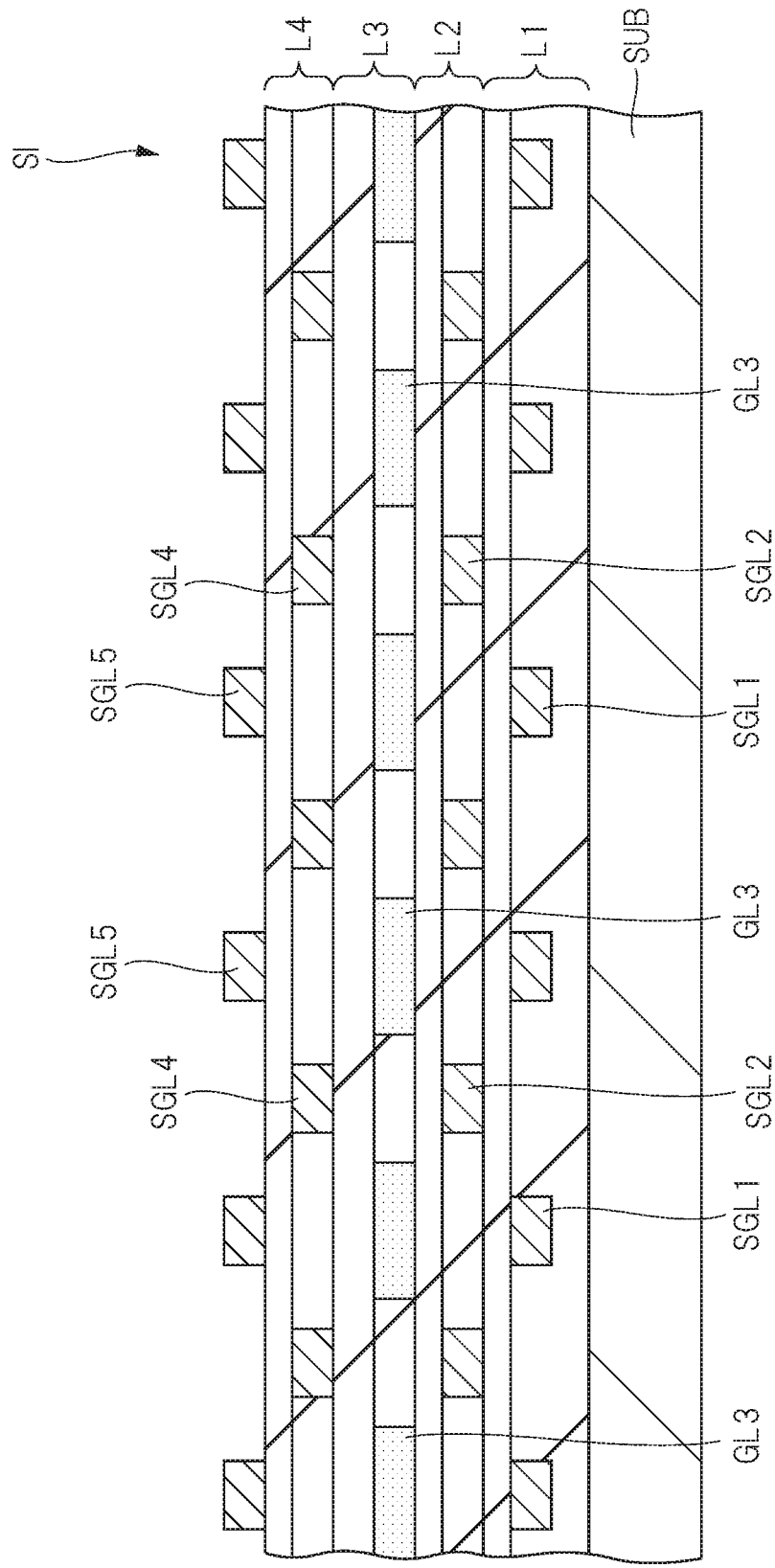
FIG. 23 is a cross-sectional view showing a schematic configuration of an interposer according to a modification example of the third embodiment.

Specifically, FIG. 23 is a cross-sectional view showing a schematic configuration of an interposer SI of a modification example of the third embodiment. In FIG. 23, the interposer SI has, for example, the substrate SUB made of silicon, and the wiring layer L1 is formed on this substrate SUB. The wiring layer L2 is formed on the wiring layer L1, and the wiring layer L3 is formed on the wiring layer L2. In addition, the wiring layer L4 is formed on the wiring layer L3. The plurality of signal wirings SGL1 are formed in the wiring layer L1. Subsequently, the plurality of signal wirings SGL2 are formed in the wiring layer L2. Each of the plurality of signal wirings SGL2 is arranged so as not to overlap the signal wiring SGL1 in a plan view. Next, the plurality of reference wirings GL3 are formed in the wiring layer L3. Each of the plurality of reference wirings GL3 is arranged so as not to overlap the signal wiring SGL2 in a plan view but so as to overlap the signal wiring SGL1 in a plan view. And, the plurality of signal wirings SGL4 are formed in the wiring layer L4. Each of the plurality of signal wirings SGL4 is arranged so as to overlap the signal wiring SGL2 in a plan view but so as not to overlap the reference wiring GL3 in a plan view. The plurality of signal wirings SGL5 are formed on the wiring layer L4. Each of the plurality of signal wirings SGL5 is arranged so as not to overlap the signal wiring SGL2 (SGL4) in a plan view but so as to overlap the reference wiring GL3 and the signal wiring SGL1 in a plan view.

In the interposer SI of the present modification example configured as described above, the configuration having the first and second features of the above-described first embodiment is applied to the wiring layer L2, the wiring layer L3 and the wiring layer L4. Therefore, in order to transmit the high-speed signals such as the data signal and the clock signal that are easy to be influenced by the cross talk, the signal wiring SGL2 arranged in the wiring layer L2 and the signal wiring SGL4 arranged in the wiring layer L4 can be used. Meanwhile, in the interposer SI of the present modification example, the configuration having the first and second features of the above-described first embodiment is not applied to the wiring layer L1. Therefore, it is difficult to use the signal wiring SGL1 arranged in the wiring layer L1 in order to transmit the high-speed signals that are easy to be influenced by the cross talk. Accordingly, the slow-speed signal such as the control signal that is difficult to be influenced by the cross talk can be transmitted through the signal wiring SGL1 arranged in the wiring layer L1. In the present modification example, the signal transmission property of the signal transmitting through the signal wiring SGL2 arranged in the wiring layer L2 and the signal transmission property of the signal transmitting through the signal wiring SGL4 arranged in the wiring layer L4 are almost symmetrical to each other, and therefore, it is not required to form the reference wiring above the wiring layer L4. Therefore, for example, the signal wiring SGL5 through which the slow-speed signal such as the control signal that is difficult to be influenced by the cross talk is transmitted can be formed above the wiring layer L4. In this manner, according to the interposer SI of the present modification example, a lot of signal wirings can be arranged in the less wiring layers. As a result, according to the interposer SI of the present modification example, the interposer SI can be thinned while the performance of the interposer SI is improved.

In the foregoing, the invention made by the present inventor has been concretely described on the basis of the embodiments. However, it is needless to say that the present invention is not limited to the foregoing embodiments and various modifications and alterations can be made within the scope of the present invention.

What is claimed is:

1. A semiconductor device comprising:
a wiring substrate;
an interposer mounted on the wiring substrate;
a first semiconductor component mounted on the interposer; and
a second semiconductor component mounted on the interposer so as to be distant from the first semiconductor component,
wherein the interposer includes:
a base containing a semiconductor material as a main body; and
a plurality of wiring layers formed on the base,
wherein the plurality of wiring layers includes:
a first wiring layer including a plurality of first wirings, each of the plurality of first wirings functioning as a signal wiring;
a second wiring layer formed above and on the first wiring layer without intervening another wiring layer that is different from the first and second wiring layers therebetween, the second wiring layer including a plurality of second wirings, each of the plurality of second wirings functioning as a reference wiring; and
a third wiring layer formed above and on the second wiring layer without intervening another wiring layer different from the second and third wiring layers therebetween, the third wiring layer including a plurality of third wirings, each of the plurality of third wirings functioning as the signal wirings,
wherein, within the first wiring layer, the plurality of first wirings is spaced apart from adjacent first wirings by a first distance without having wirings different from the first wirings therebetween,
wherein, within the second wiring layer, the plurality of second wirings being spaced apart from adjacent second wirings by a second distance without having wirings different from the second wirings therebetween,
wherein, within the third wiring layer, the plurality of third wirings being spaced apart from adjacent third wirings by a third distance without having wirings different from the third wirings therebetween,
wherein, in a plan view, the plurality of first wirings overlaps the plurality of third wirings, respectively,
wherein each of the plurality of second wirings is disposed in between two adjacent first wirings such that the plurality of second wirings does not overlap the plurality of first wirings in the plan view,
wherein each of the plurality of second wirings is disposed in between two adjacent third wirings such that the plurality of second wirings does not overlap the plurality of third wirings in the plan view,
wherein the second distance of the plurality of second wirings is set to be 1) shorter than a wavelength of an electromagnetic wave transmitting through each of the plurality of first wirings and 2) shorter than a wavelength of an electromagnetic wave transmitting through each of the plurality of third wirings, and
wherein the first semiconductor component and the second semiconductor component are electrically connected to each other through the plurality of first wirings, the plurality of second wirings and the plurality of third wirings.

2. The semiconductor device according to claim 1, wherein
the plurality of wiring layers further includes a fourth wiring layer formed above the third wiring layer,
the fourth wiring layer includes a plurality of fourth wirings functioning as reference wirings,
the first semiconductor component and the second semiconductor component are further electrically connected to each other through the plurality of fourth wirings,
in the plan view, the plurality of fourth wirings overlaps the plurality of second wirings, respectively, and
in the plan view, the plurality of fourth wirings does not overlap the plurality of first wirings or the plurality of third wirings.

3. The semiconductor device according to claim 2, wherein
the first wiring layer includes a first interlayer insulating layer,
the second wiring layer includes a second interlayer insulating layer,
the third wiring layer includes a third interlayer insulating layer, and
a thickness of the third interlayer insulating layer is larger than a thickness of the first interlayer insulating layer and a thickness of the second interlayer insulating layer.

4. The semiconductor device according to claim 2, wherein
each of the plurality of first wirings is made of a copper wiring,
each of the plurality of second wirings is made of a copper wiring,
each of the plurality of third wirings is made of a copper wiring, and
each of the plurality of fourth wirings is made of an aluminum wiring.

5. The semiconductor device according to claim 2, wherein
the fourth wiring layer has a first region and a second region, and,
in the plan view, while the plurality of fourth wirings included in the plurality of second wirings is formed in the first region, the plurality of fourth wirings is not formed in the second region.

6. The semiconductor device according to claim 1, wherein
the plurality of wiring layers further includes a fourth wiring layer formed above the third wiring layer,
a plurality of plane patterns functioning as reference wirings is formed in the fourth wiring layer,
the first semiconductor component and the second semiconductor component are further electrically connected to each other through the plurality of plane patterns, and,
in the plan view, the plurality of plane patterns is distant from each other.

7. The semiconductor device according to claim 1, wherein the plurality of second wirings is connected to each other by using a plurality of connection wirings.

8. The semiconductor device according to claim 7, wherein,
in the plan view, the plurality of second wirings includes a space between two adjacent second wirings of the plurality of second wirings, the plurality of connection wirings is arranged in the space, and a ratio of an occupation area of the plurality of connection wirings with respect to an entire area of the space is larger than 0% and equal to or smaller than 50%.

9. The semiconductor device according to claim 2, wherein the plurality of fourth wirings is connected to each other using a plurality of connection wirings.

10. The semiconductor device according to claim 1, wherein the plurality of wiring layers further includes a lower wiring layer formed below the first wiring layer, a plurality of lower-layer wirings is formed in the lower wiring layer, the first semiconductor component and the second semiconductor component are further electrically connected to each other through the plurality of lower-layer wirings, in the plan view, the plurality of lower-layer wirings overlaps the plurality of second wirings, respectively, and in the plan view, the plurality of lower-layer wirings does not overlap the plurality of first wirings or the plurality of third wirings.

11. The semiconductor device according to claim 10, wherein each of the plurality of lower-layer wirings is a signal wiring through which a signal with a frequency transmits, and the frequency of the signal transmitting through each of the plurality of lower-layer wirings is lower than a frequency of a signal transmitting through each of the plurality of first wirings and lower than a frequency of a signal transmitting through each of the plurality of third wirings.

12. The semiconductor device according to claim 11, wherein the plurality of wiring layers further includes a fourth wiring layer formed above the third wiring layer, a plurality of fourth wirings is formed in the fourth wiring layer, the first semiconductor component and the second semiconductor component are further electrically connected to each other through the plurality of fourth wirings, in the plan view, the plurality of lower-layer wirings overlaps the plurality of fourth wirings, respectively, in the plan view, the plurality of fourth wirings does note overlap the plurality of first wirings or the plurality of third wirings, in the plan view, the plurality of fourth wirings overlaps the plurality of second wirings, respectively, each of the plurality of fourth wirings is a signal wiring through which a signal with a frequency transmits, and the frequency of the signal transmitting through each of the plurality of fourth wirings is lower than the frequency of the signal transmitting through each of the plurality of first wirings and lower than the frequency of the signal transmitting through each of the plurality of third wirings.

13. The semiconductor device according to claim 1, wherein the second distance is about 3 μm.

14. The semiconductor device according to claim 13, wherein the second distance is about 1/20 times the wavelength of the electromagnetic wave transmitting through each of the plurality of first wirings, and about 1/20 times the wavelength of the electromagnetic wave transmitting through each of the plurality of third wirings.

15. The semiconductor device according to claim 14, wherein a frequency of a signal transmitting through the plurality of first wirings and a frequency of a signal transmitting through the plurality of third wirings are 2.5 THz.

16. A semiconductor device comprising:
a wiring substrate;
an interposer mounted on the wiring substrate;
a first semiconductor component mounted on the interposer; and
a second semiconductor component mounted on the interposer so as to be distant from the first semiconductor component,
wherein the interposer includes a region, the region being disposed between the first semiconductor component and the second semiconductor component, the region including:
a base containing a semiconductor material as a main body; and
a plurality of wiring layers formed on the base,
wherein the plurality of wiring layers includes:
a first wiring layer including only a plurality of first wirings, each of the plurality of first wirings functioning as a signal wiring;
a second wiring layer formed above the first wiring layer without intervening another wiring layer that is different from the first and second wiring layers therebetween, the second wiring layer including only a plurality of second wirings, each of the plurality of second wirings functioning as a reference wiring; and
a third wiring layer formed above the second wiring layer without intervening another wiring layer that is different from the second and third wiring layers therebetween, the third wiring layer including only a plurality of third wirings, each of the plurality of third wirings functioning as the signal wirings,
wherein, within the first wiring layer, the plurality of first wirings is spaced apart from adjacent first wirings by a first distance without having wirings different from the first wirings therebetween,
wherein, within the second wiring layer, the plurality of second wirings being spaced apart from adjacent second wirings by a second distance without having wirings different from the second wirings therebetween,
wherein, within the third wiring layer, the plurality of third wirings being spaced apart from adjacent third wirings by a third distance without having wirings different from the third wirings therebetween,
wherein, in a plan view, the plurality of first wirings overlaps the plurality of third wirings, respectively,
wherein each of the plurality of second wirings is disposed in between two adjacent first wirings such that the plurality of second wirings does not overlap the plurality of first wirings in the plan view,
wherein each of the plurality of second wirings is disposed in between two adjacent third wirings such that the plurality of second wirings does not overlap the plurality of third wirings in the plan view,
wherein the second distance of the plurality of second wirings is set to be 1) shorter than a wavelength of an electromagnetic wave transmitting through each of the plurality of first wirings and 2) shorter than a wavelength of an electromagnetic wave transmitting through each of the plurality of third wirings, and
wherein the first semiconductor component and the second semiconductor component are electrically connected to each other through the plurality of first wirings, the plurality of second wirings and the plurality of third wirings.

\* \* \* \* \*